US 6,738,954 B1

(12) United States Patent
Allen et al.

(10) Patent No.: US 6,738,954 B1
(45) Date of Patent: May 18, 2004

(54) METHOD FOR PREDICTION RANDOM DEFECT YIELDS OF INTEGRATED CIRCUITS WITH ACCURACY AND COMPUTATION TIME CONTROLS

(75) Inventors: Archibald J. Allen, Grand Isle, VT (US); Wilm E. Donath, New York, NY (US); Alan D. Dziedzic, Newburgh, NY (US); Mark A. Lavin, Katonah, NY (US); Daniel N. Maynard, Craftsbury Common, VT (US); Dennis M. Newns, Yorktown Heights, NY (US); Gustavo E. Tellez, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 664 days.

(21) Appl. No.: 09/636,478

(22) Filed: Aug. 10, 2000

Related U.S. Application Data
(60) Provisional application No. 60/169,612, filed on Dec. 8, 1999.

(51) Int. Cl.[7] .............................................. G06F 17/50
(52) U.S. Cl. .............................................. 716/4; 716/1
(58) Field of Search ........................ 716/4, 1; 700/110; 702/83, 84, 81; 714/724, 737, 738

(56) References Cited

U.S. PATENT DOCUMENTS

| | | | |
|---|---|---|---|
| 5,475,695 A | * 12/1995 | Caywood et al. ........... 714/738 |
| 5,497,381 A | 3/1996 | O'Donoghue et al. | |
| 5,539,752 A | 7/1996 | Berezin et al. | |
| 5,548,224 A | 8/1996 | Gabriel et al. | |
| 5,777,901 A | 7/1998 | Berezin et al. | |
| 5,793,650 A | 8/1998 | Mirza | |
| 5,822,218 A | 10/1998 | Moosa et al. | |
| 5,886,909 A | 3/1999 | Milor et al. | |
| 5,991,699 A | * 11/1999 | Kulkarni et al. ............... 702/83 |
| 6,066,179 A | * 5/2000 | Allan ............................. 716/4 |
| 6,169,960 B1 | * 1/2001 | Ehrichs ........................ 702/36 |
| 6,311,139 B1 | * 10/2001 | Kuroda et al. ................ 702/81 |
| 6,341,241 B1 | * 1/2002 | Mugibayashi et al. ....... 700/110 |

(List continued on next page.)

OTHER PUBLICATIONS

Moosa, M.S. et al, "Simulating IC Reliability with Emphasis on Process–Flaw Related Early Failures" IEEE Transactions on Reliability, vol. 44, No. 4, Dec. 1995, pp. 556–561.*

Kim, T. et al, "Modeling Manufacturing Yield and Reliability" IEEE Transactions on Semiconductor Manufacturing, vol. 12, No. 4, Nov. 1999, pp. 485–492.*

*Primary Examiner*—Vuthe Siek
*Assistant Examiner*—Magid Y Dimyan
(74) *Attorney, Agent, or Firm*—McGinn & Gibb, PLLC; Richard M. Kotulak, Esq.

(57) ABSTRACT

A method of computing a manufacturing yield of an integrated circuit having device shapes includes sub-dividing the integrated circuit into failure mechanism subdivisions (each of the failure mechanism subdivisions includes one or more failure mechanism and each of the failure mechanisms includes one or more defect mechanisms), partitioning the failure mechanism subdivisions by area into partitions, pre-processing the device shapes in each partition, computing an initial average number of faults for each of the failure mechanisms and for each partition by numerical integration of an average probability of failure of each failure mechanism, (the numerical integration produces a list of defect sizes for each defect mechanism, and the computing of the initial average includes setting a maximum integration error limit, a maximum sample size for a population of each defect size, and a maximum number of allowable faults for each failure mechansim), and computing a final average number of faults for the integrated circuit by iterativelly reducing a statistical error of the initial average number of faults for each of the failure mechanisms until the statistical error is below an error limit.

36 Claims, 13 Drawing Sheets

U.S. PATENT DOCUMENTS

| | | | |
|---|---|---|---|
| 6,367,040 B1 * | 4/2002 | Ott et al. | 714/724 |
| 6,389,323 B1 * | 5/2002 | Yang et al. | 700/110 |
| 6,393,602 B1 * | 5/2002 | Atchison et al. | 716/4 |
| 6,449,749 B1 * | 9/2002 | Stine | 716/4 |
| 6,473,665 B2 * | 10/2002 | Mugibayashi et al. | 700/110 |
| 6,516,433 B1 * | 2/2003 | Koenig | 714/737 |
| 6,518,591 B1 * | 2/2003 | Shamble et al. | 257/48 |
| 6,587,801 B2 * | 7/2003 | Funakoshi | 702/84 |
| 2002/0002415 A1 * | 1/2002 | Mugibayashi et al. | 700/110 |

* cited by examiner

METHOD FOR PREDICTION RANDOM DEFECT YIELDS OF INTEGRATED CIRCUITS WITH ACCURACY AND COMPUTATION TIME CONTROLS

This application claims the benefit of provisional application No. 60/169,612, filed Dec. 8, 1999.

BACKGROUND OF THE INVENTION

1. Field of the Invention

This invention generally relates to the prediction of electrical test yield for semiconductor integrated circuits (IC), or of electronic packages, and the influence of design and process characteristics upon those tests; more particularly, to an efficient procedure for the prediction of random defect yields which are practical for large chips.

2. Description of the Related Art

Electrical test yield is the most variable productivity component from product to product, and through the evolution and development of a process technology. Electrical test yield, Y, is defined as the product of systematic (gross) yield, $Y_0$, and random defect yield (usually the dominant component), $Y_R$. Defects may be randomly introduced during the various steps of IC fabrication. Some of these defects will cause electrical failures (faults), and similar electrical failures are collectively referred to as a failure mechanism. The random defect yield is a function of average number of faults per IC, or $\Lambda$, which is the summation of the average faults for each of the failure mechanisms, i.e. $\Lambda = \Sigma_1 \lambda_i$. The electrical test yield can therefore be mathematically defined as $$Y = Y_0 \cdot Y_R = Y_0 \cdot (1 + \Lambda/\alpha)^{-\alpha}, \qquad \text{(Equation 1)}$$

which is known as the negative binomial distribution. Other widely published yield models, such as Poisson, Seeds, Murphy, and Boltz-Einstein, may be used in place of the negative binomial distribution (Charles H. Stapper, et al., "Integrated Circuit Yield Statistics", Proceedings of the IEEE, Vol. 71, Number 4, April, 1983, incorporated herein by reference), however, the mathematics defining the average faults for a particular IC remains the same. Alternatively, some IC manufacturers compute the average faults as the product of the chip area with the average fault density; however, the fault density must be empirically determined, and varies because of diverse IC functional content.

For a given failure mechanism, numbered i, the average number of faults, $\lambda_i$, is defined as the product of the critical area, $A_{Ci}$, which is dependent upon physical layout and the defect density, $D_{Di}$. In Equation 2, critical area is shown as the product of the average probability of failure, $\theta_i$, or percent critical area, and the area of the chip, A.

$$\lambda_i = A_{Ci} \cdot D_{Di} = (\theta_i \cdot A) \cdot D_{Di} \qquad \text{(Equation 2)}$$

Critical area has been defined as the area in which the center of a defect must fall to cause an electrical failure in an integrated circuit (Stapper, et al, supra, and Wojciech Maly, et al, "Yield Estimation Model for VLSI Artwork Evaluation", Electronics Letters, Vol. 19, Number 6, March, 1983, incorporated herein by reference). Thus, a key distinction exists between defects and faults. While all faults are presumed to be caused by defects, not all defects cause faults. In this invention, defect size will be characterized by the radius of the defect, denoted r. The average probability of failure is defined as an infinite integral (which is an integral from a minimum defect radius, $r_0$, to an infinite radius, $\infty$) over the defect radii:

$$\theta_i = \int P_i(r) \cdot S(r) dr \qquad \text{(Equation 3)}$$

where $P_i(r)$ is the probability of failure function for a given failure mechanism, and is a function of defect radius, and S(r) is the size distribution, which is also a function of defect radius. While any size distribution function may be used, frequently fabricator defect inspection data is fit to equation 4:

$$S(r) = S_K/r^\beta \qquad \text{(Equation 4)}$$

The inventive methods described herein center around the computation of the probability of failure function for a given failure mechanism, $P_i(r)$. This function depends on the detail design of the IC, which is generally described in the form of a database of 2D geometries or shapes. The formal definition of the probability of failure function is:

$$P_i(r) = \int_X \int_Y \delta_i(x,y,r) dy\, dy \qquad \text{(Equation 5)}$$

where the values of the function $\delta_i(x,y,r)$ is a 1 if a defect of radius r at location (x,y) causes a fault, and 0 otherwise.

Other approaches to model electrical test yield depend upon design shape algorithms calculating probability of failures by failure mechanism for a particular IC, (Sean Fitzpatrick, et al, "A Comparison of Critical Area Analysis Tools", IEEE/SEMI Advanced Semiconductor Manufacturing Conference Proceedings, September, 1998, and Gerard A. Allen, "A Comparison of Efficient Dot Throwing and Shape Shifting Extra Material Critical Area Estimation", IEEE Defect and Fault Tolerance in VLSI System Proceedings, December, 1998, each incorporated herein by reference). One approach is the widely published Monte Carlo technique which simulates defects of predetermined sizes randomly falling on the design. Geometric (shape shifting) techniques allow a direct computation of a probability of failure for a given defect size. This method may be combined with sampling small portions of the design to ease the enormous compute resource requirements. All of these approaches are targeted at the specific problem of calculating the probability of failure for a predetermined defect size. Since it is not practical to calculate a probability of failure for every possible defect size, the defect size distribution must be approximated, introducing error into the larger problem of projecting electrical test yield. Consequently, all of the yield estimation techniques require the analyst to make some assumptions, either about the physical design characteristics, the defect size distribution, or the distribution of defects across failure mechanisms and process levels. The result is a yield estimate in which the error is not clearly understood, and there was likely an excessive amount of computer resource spent on the problem. For a fabricator making multiple ICs, the problem quickly becomes self-limiting. This application details a procedure that allows for optimization of the computer resources required for the calculation of the probability of failure for a particular failure mechanism at a specific defect size. This optimization is based upon an integrated approach, with complete error management and computational time controls, for projecting electrical test yield of a particular IC. Moreover, this procedure is practical for a manufacturing environment where multiple ICs of complex function are fabricated.

SUMMARY OF THE INVENTION

It is, therefore, an object of the present invention to provide a structure and method for computing the electrical test yield of an IC. The present invention takes as input an IC in the form of a database of shapes, and a fabrication process described in terms of failure mechanisms, defect densities per failure mechanism, defect size distribution, and a yield model. The present invention computes an estimate of the electrical test yield, including the average number of faults per IC, the average number of faults per failure mechanism of the IC, and an estimate of the error in the computation of these quantities.

The present invention computes a predicted yield of an IC that will be manufactured with a given manufacturing technology through the following processes:

1. Subdivide the IC into subdivisions, each of which contains multiple layers, each layer relating to a different failure mechanism. These subdivisions are called failure mechanism subdivisions.
2. Optionally, partition the failure mechanism subdivisions by area. The objective of these two partitioning steps is to reduce the computational effort of the remaining steps.
3. Pre-process the shapes in each partition to apply manufacturing process simulation steps such as layer biasing (shrinks or expands), optical proximity effects, etc.
4. Compute an initial estimate of the average number of faults for each failure mechanism (e.g., short, open, etc.) and each area partition by numerical integration of the percent critical area (e.g., numerical integration of a failure mechanism's average probability of failure). This initial integration will produce a list of defect sizes for each failure mechanism (and each partition of each failure mechanism). The computational effort of this step is controlled by a maximum integration error limit, a sample size for the population of defects of each defect size (radius), and a maximum number of allowable faults.
5. Compute the final estimate of the average number of faults per IC by iteratively reducing the statistical error of the computation resulting from step 4 by repeating steps 6–10 until the statistical error is below the desired error limit.
6. Select the total number of defects (or total sample size) to be analyzed.
7. Distribute the total sample size among all the defect sizes of all the failure mechanisms. The sample sizes for each defect size of each defect mechanism are selected to maximize the reduction in the statistical error.
8. Compute probability of fault for each defect size and each defect mechanism with the selected sample size.
9. Compute the average number of faults for the current samples and the statistical error of the current sample.
10. Combine the results of this sample with the results of previous samples.
11. Compute the yield estimate using equation 1 or a similar equation.

It is a further object of the present invention to compute the average number of faults for a failure mechanism by predicting defect sizes and the number of defects by defect size (sample size), selecting a location and size for each defect, computing whether each defect results in a fault, summing the number of faults to compute the probability of failure by defect size, thus producing a probability of failure function, and integrating the product of the probability of failure function with the defect size distribution function to obtain the average number of faults as shown in Equation 2.

This invention controls the error in the integration that computes the average number of faults by a controlled selection of the number of defect sizes and of the specific defect sizes.

This invention also controls the statistical error of the average number of faults per IC by a controlled selection of the number of defects per defect size for each failure mechanism. The controlled selection of sample sizes takes into account the relative importance of the individual statistical errors of each defect size of each failure mechanism in the total statistical error of the average number of faults per IC.

The invention may also include partitioning the IC, computing the average number of faults per failure mechanism for each partition, and combining the average number of faults for all partitions and all the failure mechanisms to produce the average faults for the IC. The method for the control of the statistical error is extended to include partitioning of the IC.

The invention may also comprise a system for computing the electrical test yield of an IC that includes a computational unit which determines whether a defect causes a fault on the IC, another computational unit for computing a probability of failure for each defect size of each failure mechanism, and a further computational unit that selects defect sizes for a failure mechanism, computes the average number of faults for each failure mechanism, and then selects the sample sizes for each defect size.

The inventive system may also include a plurality of computational units simultaneously computing the average number of faults for each failure mechanism in each partition of the IC. The inventive system may further include a plurality of the computational units simultaneously computing a probability of failure for each of the defects and/or a sample size selector controlling statistical error of the probability of failure for the IC by controlled selection of a sample size of the defects in the predicting step. The sample size selector can also control integration error of the probability of failure for the IC by controlled selection of sizes of the defects and controlled selection of a number of the sizes.

BRIEF DESCRIPTION OF THE DRAWINGS

The foregoing and other objects, aspects, and advantages will be better understood from the following detailed description of a preferred embodiment of the invention with reference to the drawings, in which.

Figure 8:
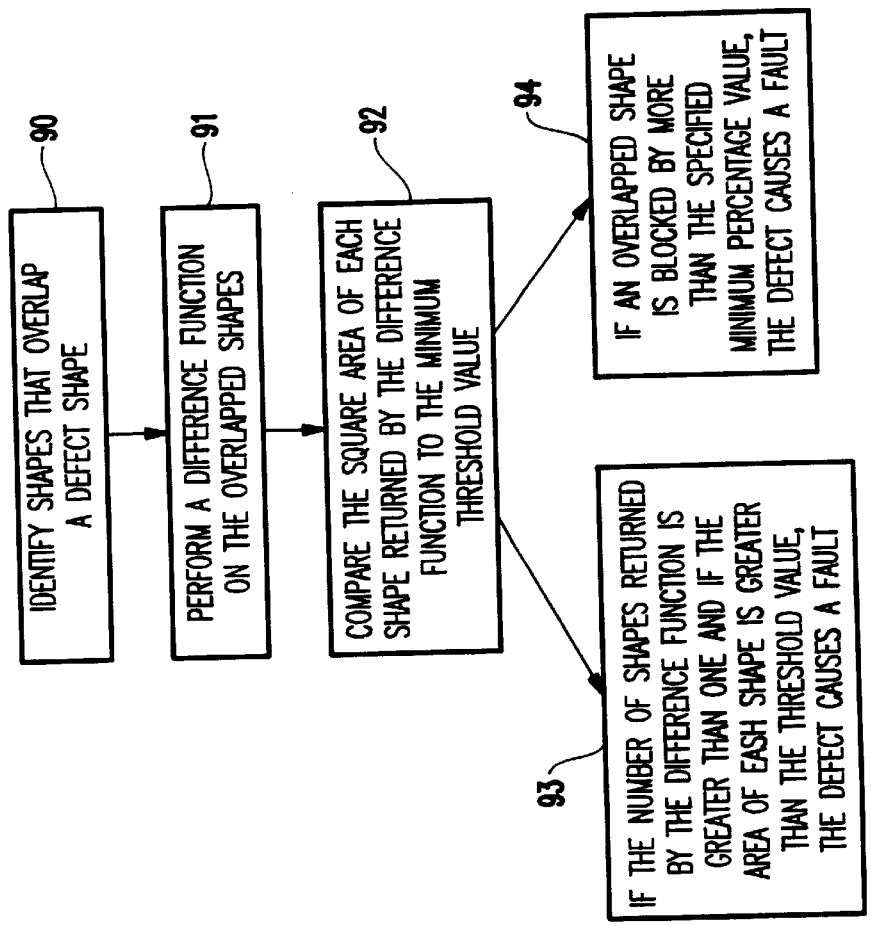
Figure 9:
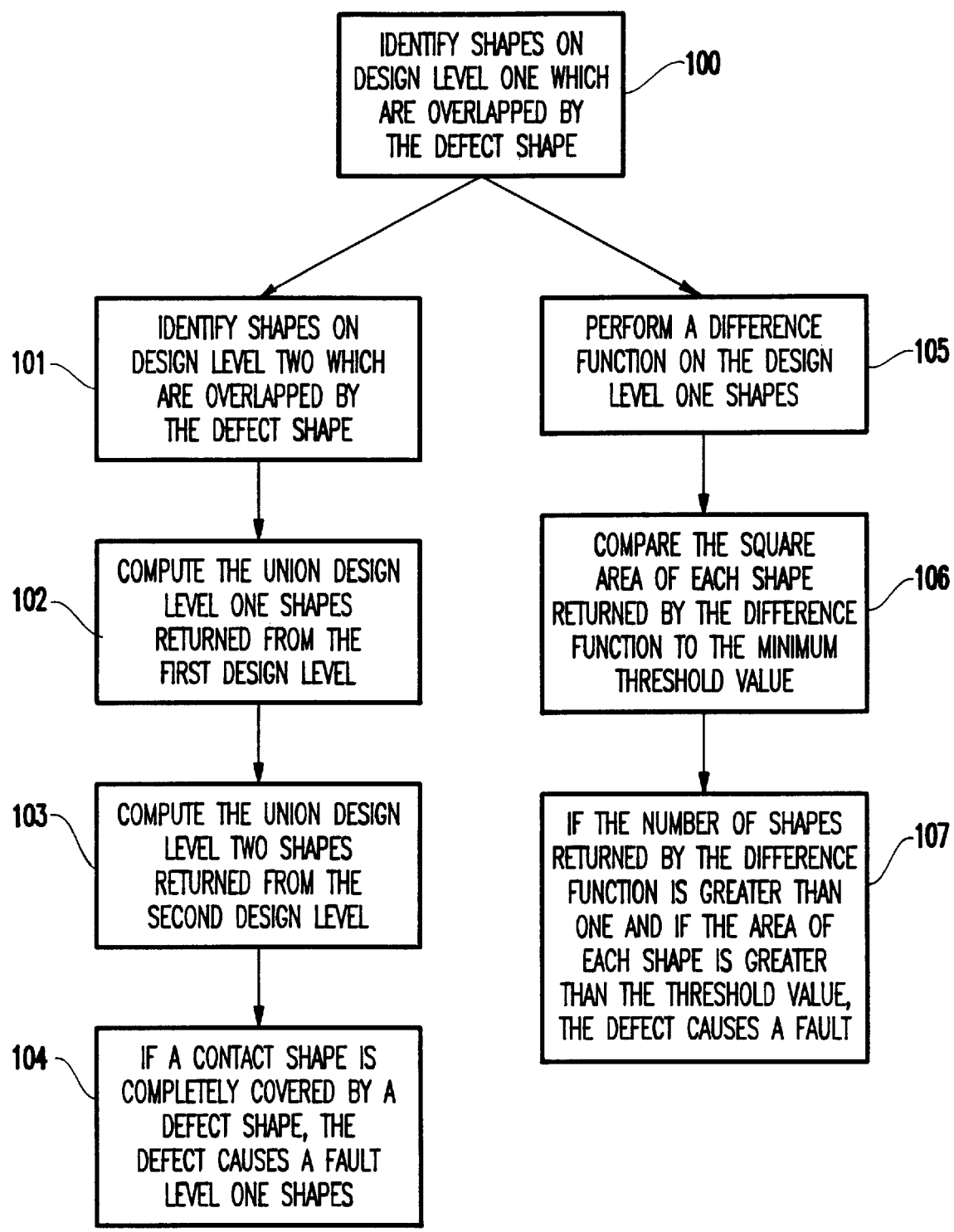
Figure 10:
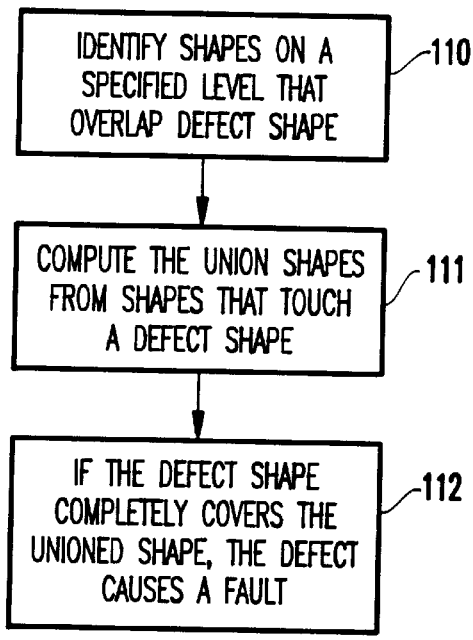
Figure 11:
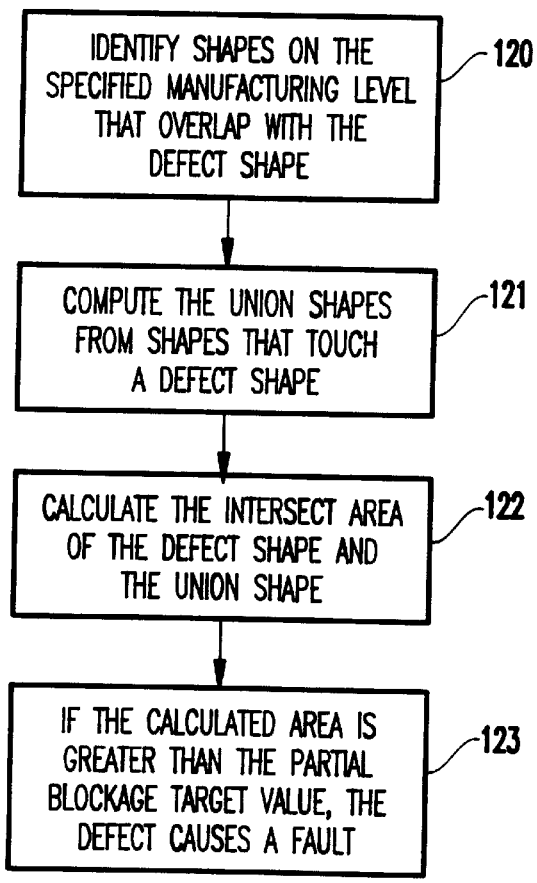
Figure 12:
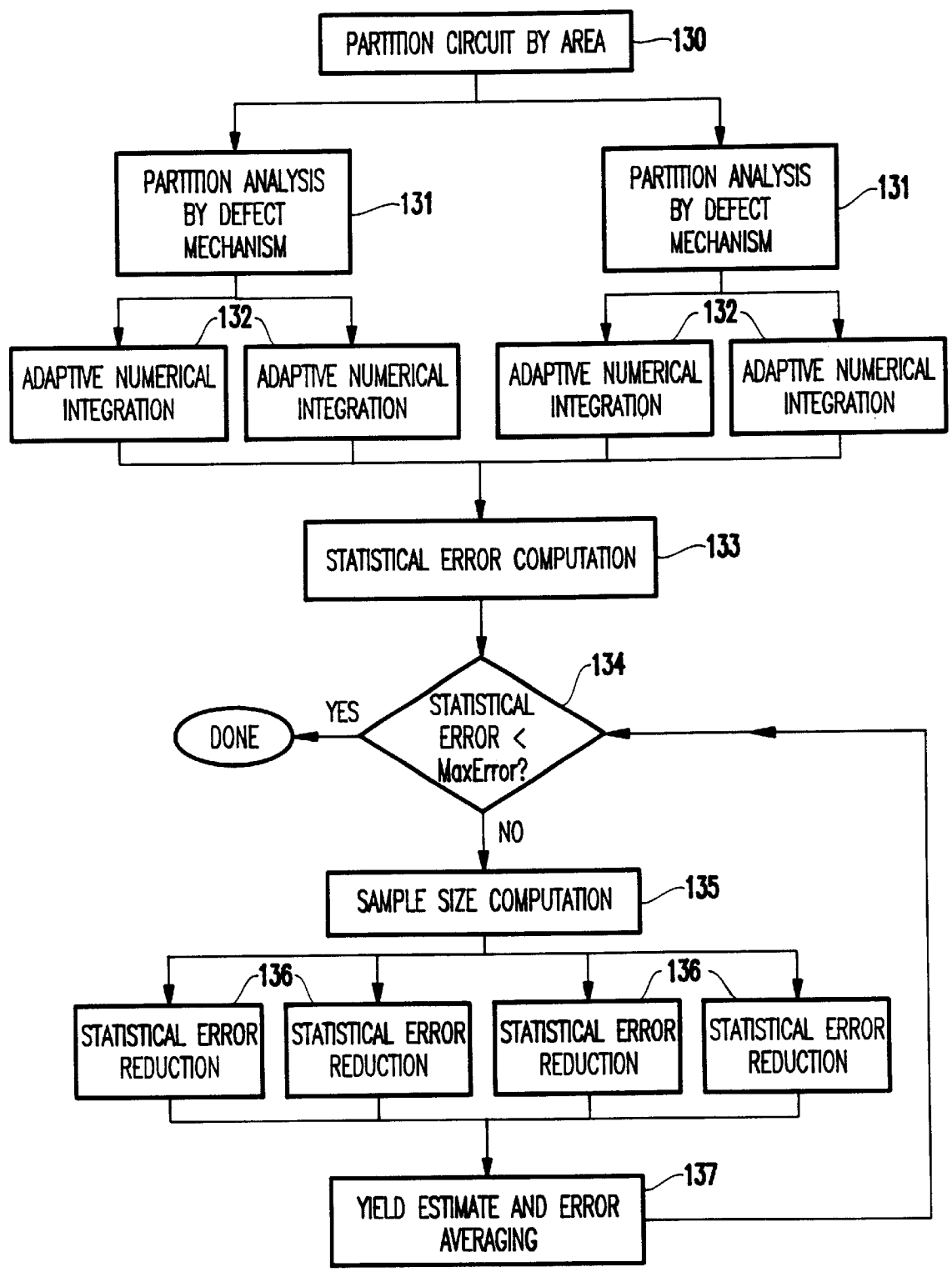
Figure 13:
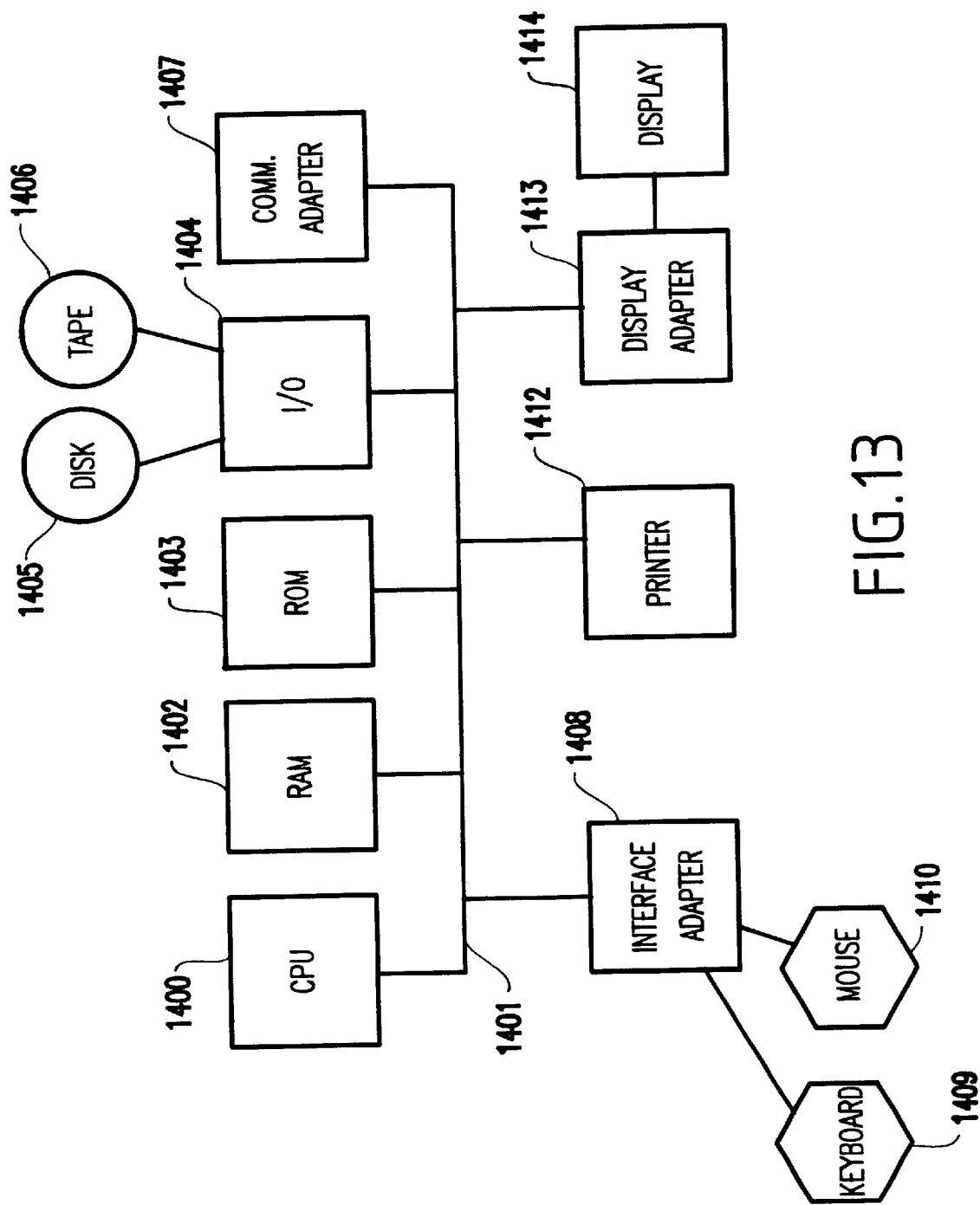
Figure 16A:
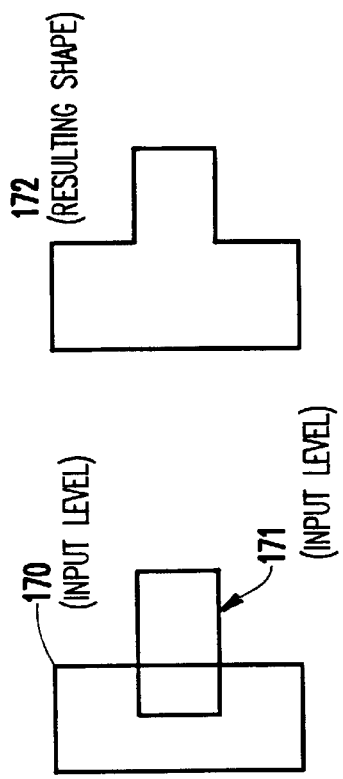
Figure 16B:
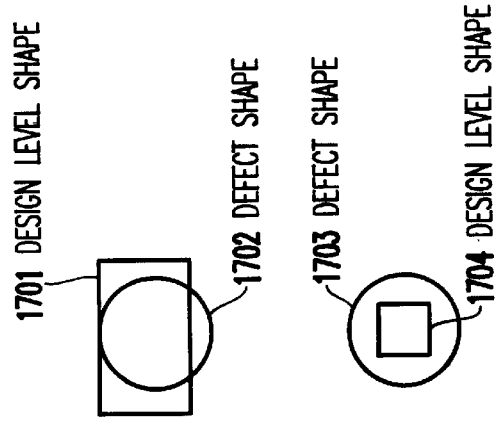
Figure 14:
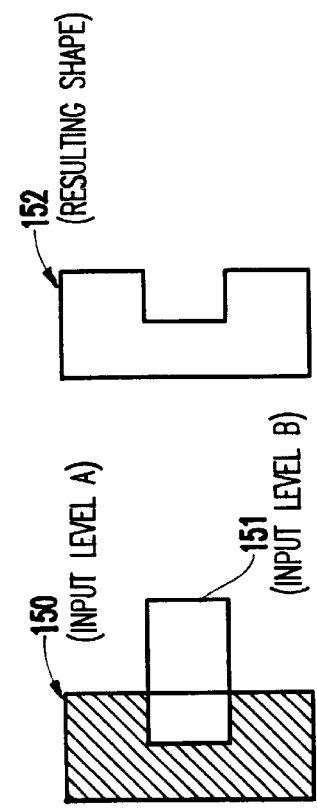
Figure 15:
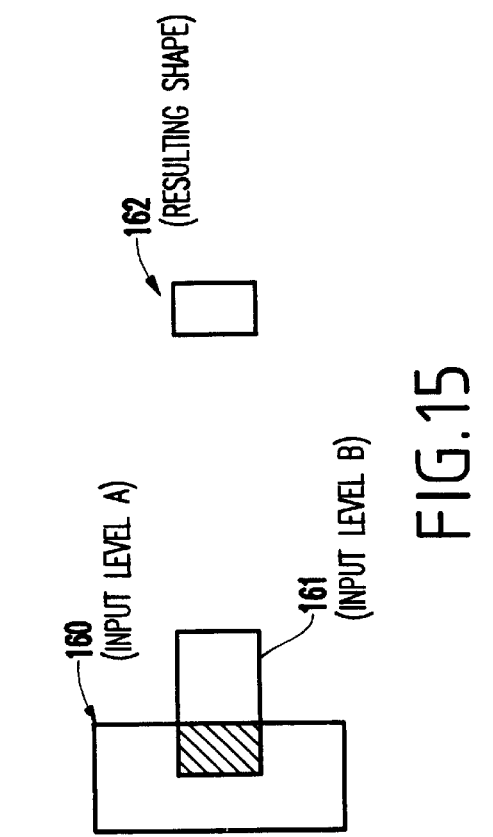
Figure 17:
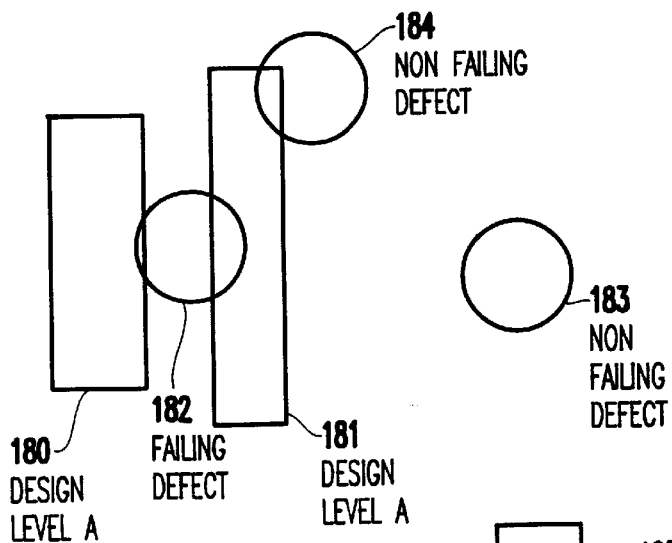
Figure 18:
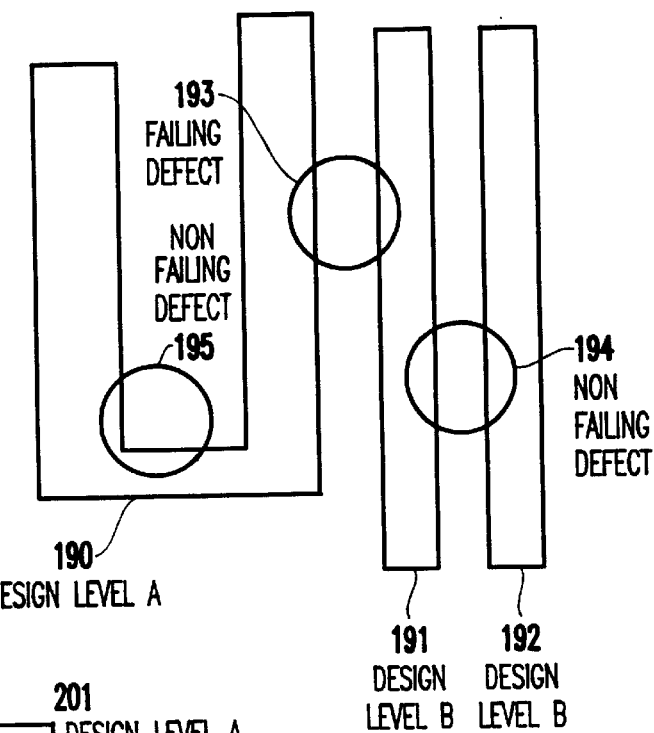
Figure 19:
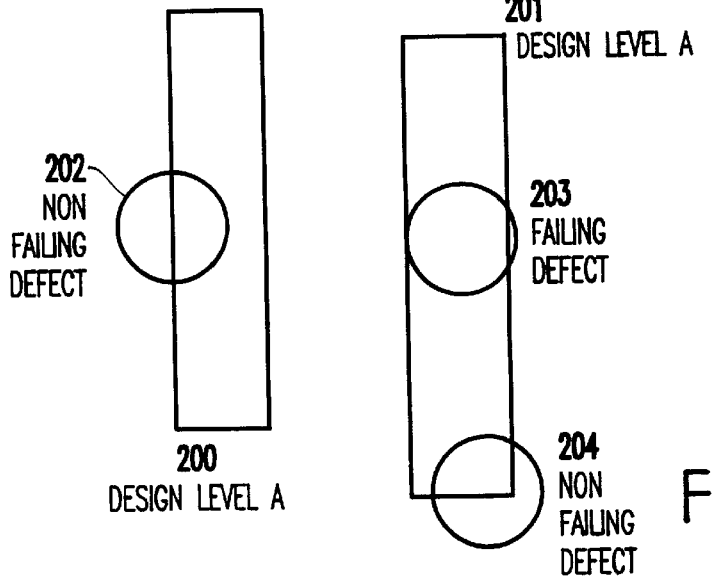
Figures 20, 21:
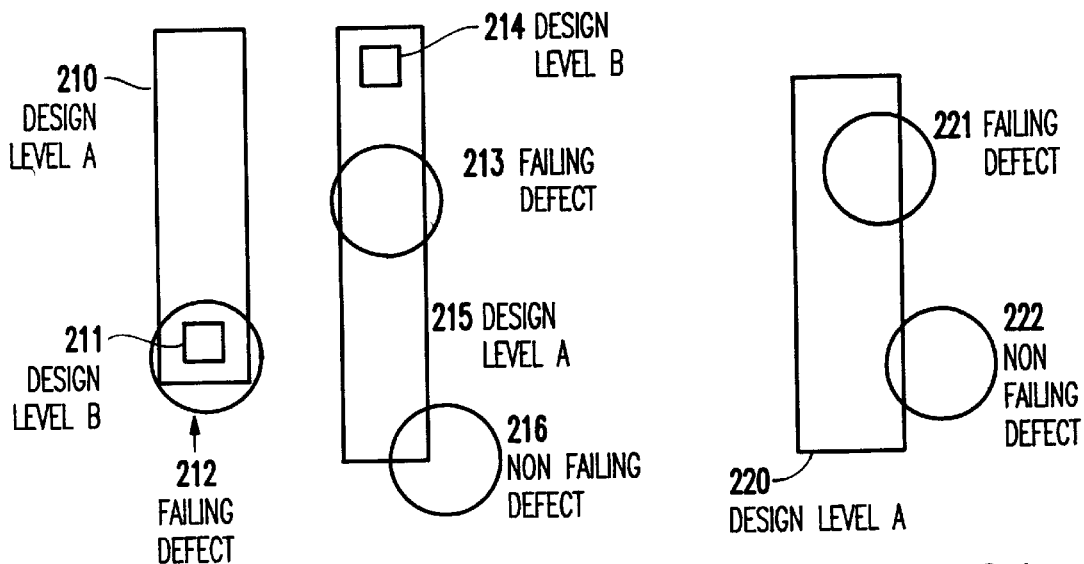
Figures 22, 23:
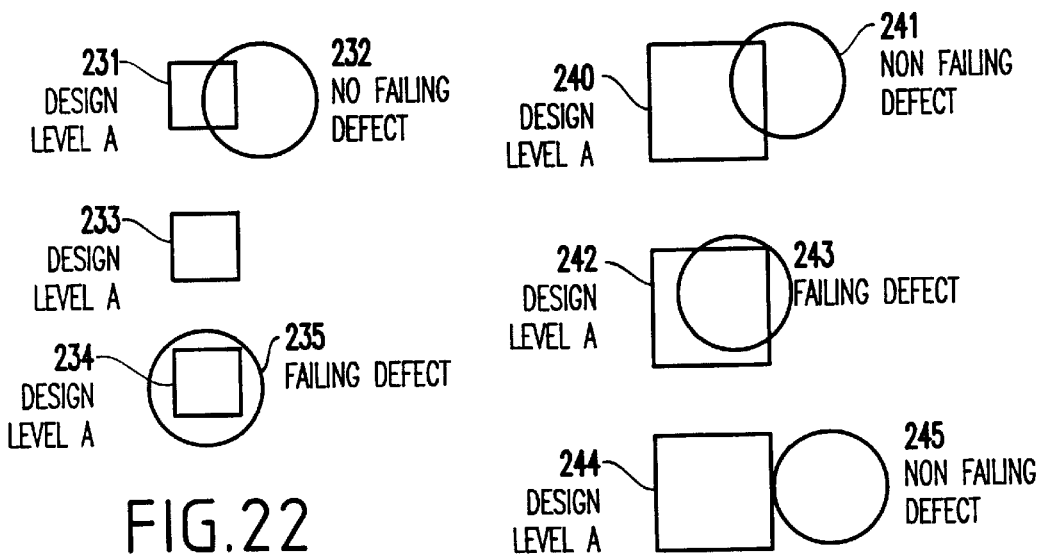
Figure 24:
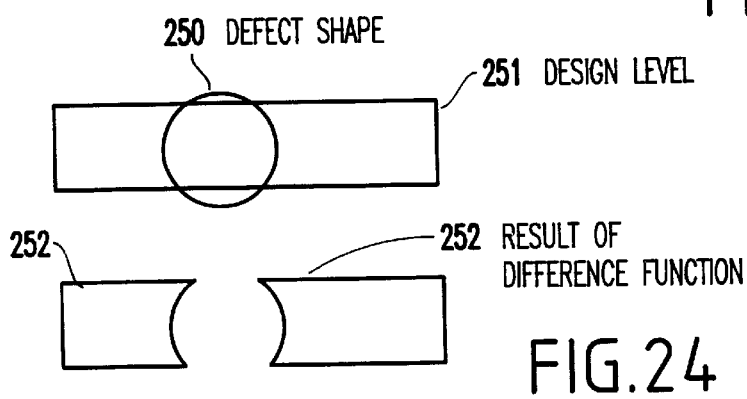
Figure 25:
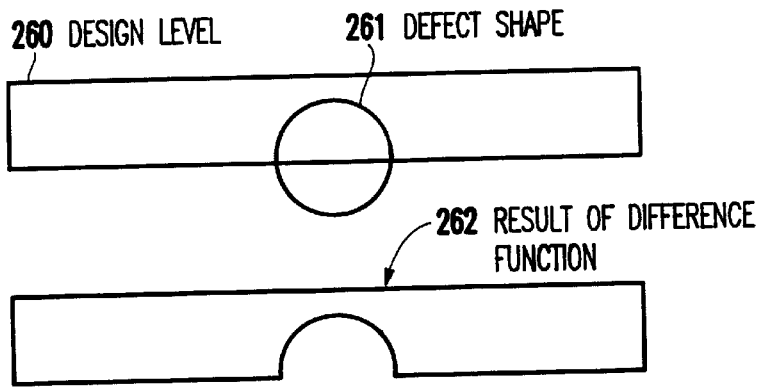
Figure 26:
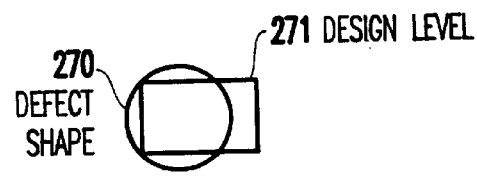
Figure 27:
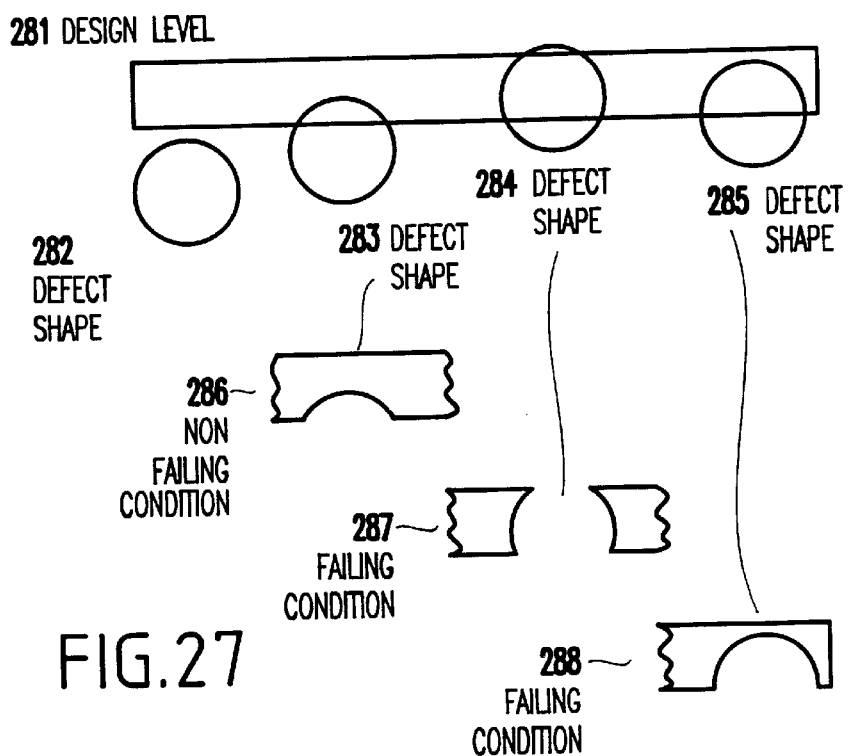

to FIG. 8 is a flow diagram illustrating the method for partial opens;

FIG. 9 is a flow diagram illustrating the method for opens with contacts;

FIG. 10 is a flow diagram illustrating the method for blocks fault detection;

FIG. 11 is a flow diagram illustrating the method for partial blocks detection;

FIG. 12 is a flow diagram illustrating one embodiment of the invention;

FIG. 13 is a hardware embodiment of the invention;

FIG. 14 is a schematic diagram illustrating a difference function according to the invention;

FIG. 15 is a schematic diagram illustrating an intersect function according to the invention;

FIG. 16A is a schematic diagram illustrating a union function according to the invention;

FIG. 16B is a schematic diagram illustrating the use of the contains method according to the invention;

FIG. 17 is a schematic diagram illustrating a shorts failure mechanism according to the invention;

FIG. 18 is a schematic diagram illustrating a two level shorts failure mechanism according to the invention;

FIG. 19 is a schematic diagram illustrating an opens failure mechanism according to the invention;

FIG. 20 is a schematic diagram illustrating an opens with contacts failure mechanism according to the invention;

FIG. 21 is a schematic diagram illustrating a partial opens failure mechanism according to the invention;

FIG. 22 is a schematic diagram illustrating a blockage defect mechanism according to the invention;

FIG. 23 is a schematic diagram illustrating a partial blockage defect mechanism;

FIG. 24 is a schematic diagram illustrating the operation of the difference function to determine a failing defect according to the invention;

FIG. 25 is a schematic diagram illustrating the difference function determining a failing defect according to the invention;

FIG. 26 is a schematic diagram using the intersect operation to determine a partial blockage failure mechanism according to the invention; and FIG. 27 is a schematic diagram illustrating the use of the opens and partial opens failure mechanism to create a single defect mechanism according to the invention.

DETAILED DESCRIPTION OF PREFERRED EMBODIMENTS OF THE INVENTION

The electrical test yield of an IC may be predicted using a computer modeling program prior to the actual physical production. Such conventional modeling programs assess the circuit layout sensitivity to unintended opens or shorts, which may be the result of foreign material present in a clean room manufacturing environment.

In this application such particles of foreign matter on the surface of a wafer are referred to as defects, and those defects causing the circuit to operate in an unintended manner (electrical failure) are faults. The invention classifies faults into different defect mechanisms. Interacting defect mechanisms are collectively referred to as a failure mechanism. For example, a single layer of patterned metal wiring (metal 1) could have two failure mechanisms, one being a metal 1 open failure mechanism and the other being a metal 1 short failure mechanism. Each of these failure mechanisms would be made up of one or more defect mechanisms. Therefore, the metal 1 short failure mechanism could include a single defect mechanism (e.g., a single level short on metal 1). To the contrary, the metal 1 open failure mechanism could include, for example, three defect mechanisms (an open within metal 1, an open between metal 1, a first contact via, an open between metal 1, and a second contact via).

While the preferred embodiment of this invention focuses on failure mechanisms having defect size dependencies, defect size independent mechanisms may also be evaluated with the invention. For a defect of a size dependent failure mechanism to produce a fault, it must be of sufficient size and in a location where it can cause a short or open. For example, if it were large enough and in the correct location, a particle of foreign matter could block a conductive line (or insulator) from being formed, which would cause an unintended open (or short).

Therefore, various assumptions (based on historical measurements/experiments) can allow evaluation of a predicted set of failure mechanisms for a given manufacturing process. As described below, the invention computes the probability that distributions of defects for selected failure mechanisms will cause faults, based on the size and location of the defects.

More specifically, the invention comprises a method and system for computing the electrical test yield of ICs by selecting the set of failure mechanisms that describe the manufacturing process, computing the average number of faults for each failure mechanism, parallelizing the fault computation into individual sub-computations, and minimizing the computational effort by adjusting error parameters for the individual sub-computations.

The inventive yield measurement method is practical for very large ICs because the invention dynamically computes and manages fault (and yield) error estimates. Thus, the computation effort in the inventive yield measurement can be controlled by proper selection of the error input parameters.

The yield of the part is obtained by computing the random defect yield, which is a function of average number of faults per IC, or $\Lambda$. The average number of faults is the summation of the average faults for each of the failure mechanisms, i.e.:

$$\Lambda = \Sigma_i \lambda_i. \qquad \text{(Equation 6)}$$

The yield of the part is therefore a function of the percent critical area by adding Equation 2 to Equation 6:

$$\Lambda = \Sigma_i \theta_i \cdot A \cdot D_{Di}. \qquad \text{(Equation 7)}$$

The computation of the yield of an IC therefore consists of a series of sub-computations of the percent critical area for each failure mechanism. The average probabilities of failure for a given defect mechanism may in turn be obtained through sub-computations over a set of area partitions, each of which has area $A_P$ that cover the integrated circuit. In this case the percent critical area becomes:

$$\Lambda = \Sigma_i \Sigma_P \theta_{ip} \cdot A_P \cdot D_{Di}. \qquad \text{(Equation 8)}$$

The invention measures a failure mechanism's average probability of failure, $\theta_i$, or percent critical area, through the use of a discrete numerical integration. The numerical integration that computes the average probability of failure selects the smallest number of discrete defect radii such that a preselected integration error limit is satisfied. For a failure mechanism and a defect radius, $r_{ik}$, a probability of failure, $p_{ik}$, (see Equation 5) is computed by generating a sample of $n_{ik}$ (sample size) defects located at randomly selected locations in the IC (this is known as a Monte Carlo method for computing Equation 5). The methods detailed later in the invention are then used to determined the number of faults resulting from these defects, $f_{ik}$. The probability of failure for defect radius, $r_{ik}$, is given by:

$$p_{ik}=f_{ik}/n_{ik}. \qquad \text{(Equation 9)}$$

During the numerical integration stage, a constant, pre-selected sample size for the probability of fault computation, is used. The objective of the numerical integration is to select the smallest set of defect radii possible, thus minimizing computation effort. The numerical integration approximates the probability of function, $P_i(r)$, by selecting defect radii and evaluating the probability of fault at each discrete radius. Given selected radii, the probability of fault function, $P_i(r)$, is approximated by linear or quadratic interpolation. Using an interpolation, and a known defect size distribution, $S(r)$, Equation 10 is a discrete integration formula for the integral in Equation 3:

$$\theta_i = \Sigma_K p_{ik} \cdot w_{ik} \qquad \text{(Equation 10)}$$

The $w_{ik}$ values are integration weights that depend on the exact function of $S(r)$ and on the values of the selected radii. For example, for a linear interpolation of $P_i(r)$ and $S(r)=r_0^2/r^3$, the average probability of fault becomes:

$$\theta_i = \Sigma_K r_0^2 \cdot (r_k - r_{k-1}) \cdot (p_k r_{k-1} - p_{k-1} r_k)/(r_{k-1}^2 r_k^2) + r_0^2 p_K / r_K^2. \qquad \text{(Equation 11)}$$

The last element in the sum that computes the average probability of fault takes into account the infinite part of the infinite integral. The numerical integration first searches for defect radii with non-zero probability of fault. If no such radii are found, the percent critical area is zero. Then, the integration computes an estimate of the integration error by comparing the integral of a coarse approximation of $P_i(r)$ to an integral of an accurate approximation of the function. This method is used to find three successive radii with the largest contribution to the integration error. Intermediate radii are then selected and their probabilities of fault are computed, thus decreasing the integration error. This process is repeated until the integration error falls below a pre-specified error limit.

Figure 1:
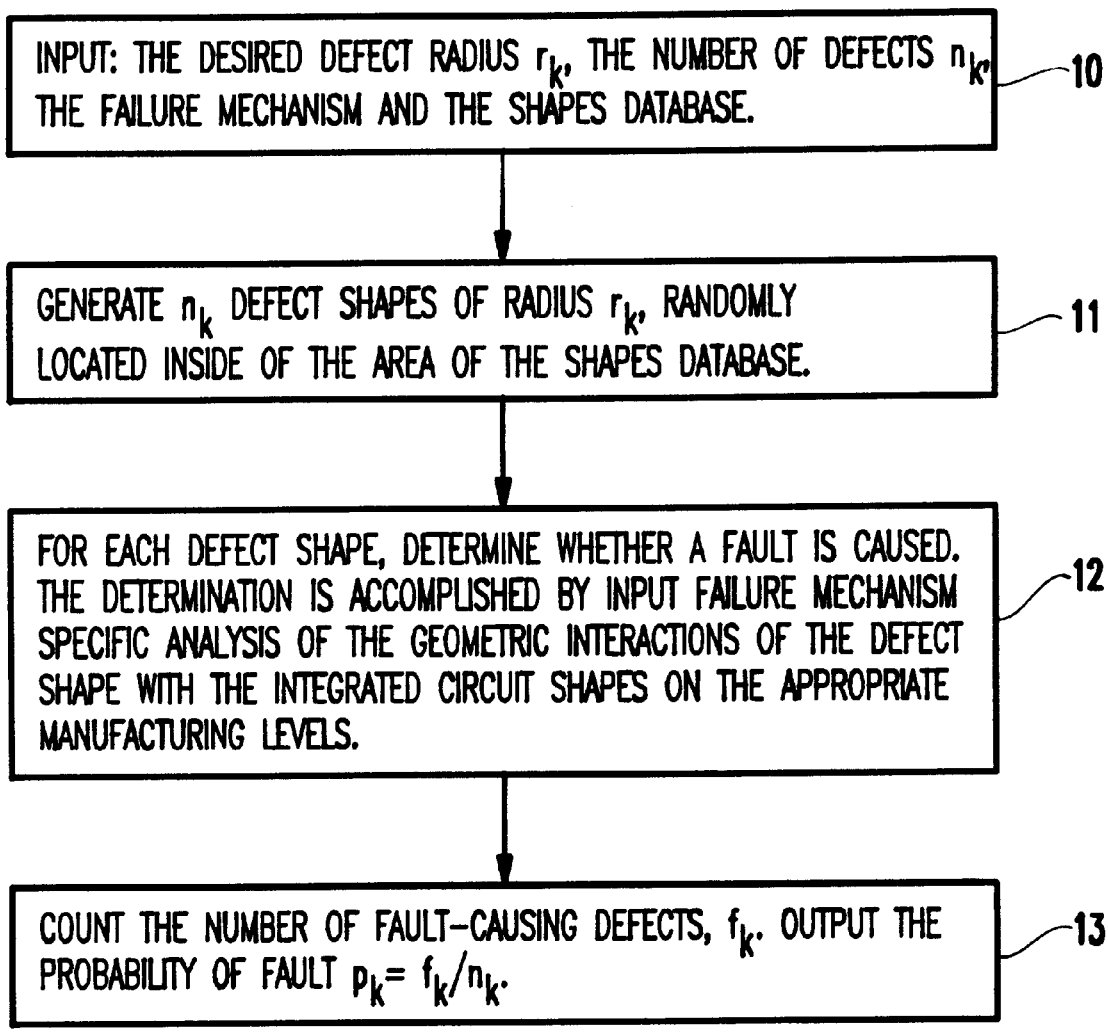
FIG. 1 is a flow diagram illustrating the probability of fault computation for a given failure mechanism and a given defect radius.

Referring to the figures now, FIG. 1 illustrates the probability of fault computation for a given failure mechanism and a given defect radius, $r_k$. The failure mechanism subscript i and the partition subscript, p, are omitted for clarity. In item 10, the desired defect radius $r_k$, the number of defects, $n_k$, the failure mechanism, and the shapes database are input. Then, in item 11, the invention generates $n_k$ defect shapes of radius, $r_k$, randomly located inside the area of the shapes database. For each defect shape, the invention determines whether a fault is caused (item 12). This determination is accomplished by an input failure mechanism specific analysis of the geometric interactions of the defect shape with the integrated circuit shapes on the appropriate manufacturing levels. Then, the number of fault-causing defects, fk, are counted and the invention outputs the probability of fault $p_k=f_k/n_k$ in item 13.

Figure 2:
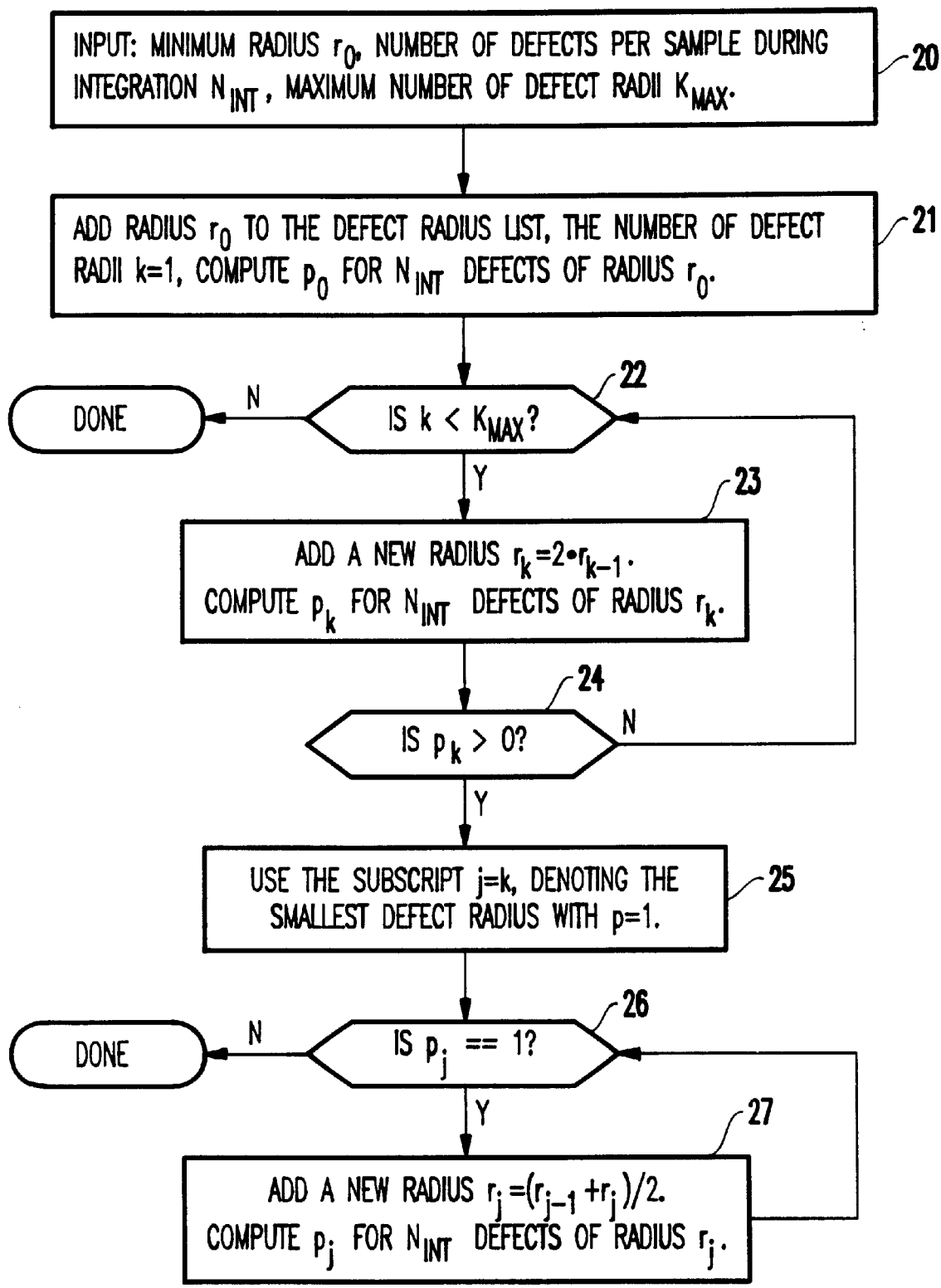
FIG. 2 is a flow diagram illustrating computation of the initial defect radii during the initial integration phase of the average critical area for a given failure mechanism.

FIG. 2 illustrates a computation of the initial defect radii during the initial integration phase of the average critical area for a given failure mechanism. The failure mechanism subscript i and the partition subscript p are omitted for clarity. In item 20 (in FIG. 2), the minimum radius $r_0$, number of defects per sample during integration, $N_{INT}$, and maximum number of defect radii, $K_{MAX}$, are input. Next, as shown in item 21, the invention adds radius $r_0$ to the defect radius list (the number of defect radii k=1) and computes $P_o$ for $N_{INT}$ defects of radius $r_o$. If k is not less than $K_{MAX}$, processing ends, as shown in item 22. If k is less than $K_{MAX}$, processing continues with item 23 in which the invention adds a new radius $r_k=2 \cdot r_{k-1}$ and computes $P_k$ for $N_{INT}$ defects of radius $r_k$. If $P_k$ is not greater than 0, as shown in item 24, processing returns to item 22. If $p_k$ is greater than 0, processing proceeds to item 25 in which the invention uses the subscript j=k and denotes the smallest defect radius with p=1. If pj==1, as shown in item 26, processing proceeds to item 27. Otherwise, the process is complete. In item 27, the invention adds a new radius $r_j=(r_{j-1}+r_j)/2$ and computes $P_j$ for $N_{INT}$ defects of radius $r_j$.

Figure 3:
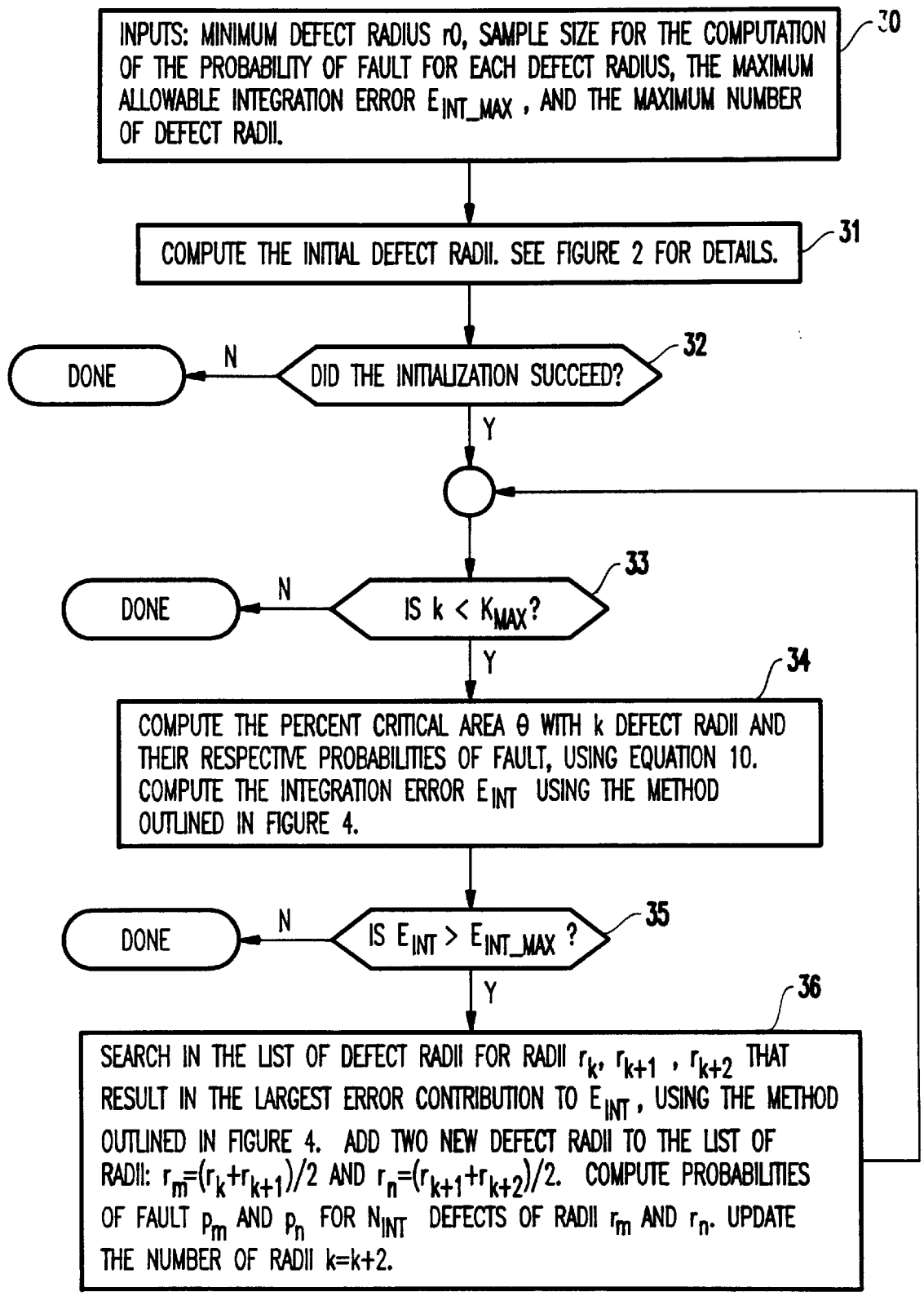
FIG. 3 is a flow diagram illustrating the numerical integration method for the estimation of the percent critical area for a given failure mechanism.

FIG. 3 is a flow diagram illustrating the numerical integration method for the estimation of the percent critical area for a given failure mechanism. The failure mechanism subscript i and the partition subscript p are omitted for clarity. Here, the to invention determines the smallest set or list of defect radii such that the resulting numerical integration error of the percent critical area is less than a preselected error $E_{INT\_MAX}$.

In item 30 (in FIG. 3), the minimum defect radius r0, sample size for the computation of the probability of fault for each defect radius, the maximum allowable integration error $E_{INT\_MAX}$, and the maximum number of defect radii are input. Item 31 represents the computation of the initial defect radii, as shown in FIG. 2. If the initialization did not succeed, the process is terminated, as shown in item 32. However, if the initialization did succeed, processing proceeds to item 33. In item 33, if k is not less than $K_{MAX}$, processing ends. If k is less than $K_{MAX}$, processing proceeds to item 34 in which the invention computes the percent critical area 0 with k defect radii and their respective probabilities of fault, using Equation 10, and computes the integration error $E_{INT}$ using the method outlined in FIG. 4.

If $E_{INT}$ is not greater than $E_{INT\_MAX}$, processing terminates, as shown in item 35. If $E_{INT}$ is greater than $E_{INT\_MAX}$, processing proceeds to item 36 where the invention searches in the list of defect radii for radii $r_k$, $r_{k+1}$, $r_{k+2}$ that result in the largest error contribution to $E_{INT}$, using the method outlined in FIG. 4, adds two new defect radii to the list of radii: $r_m=(r_k+r_{k+1})/2$ and $r_n=(r_{k+1}+r_{k+2})/2$, and updates the number of radii k=k+2.

Figure 4:
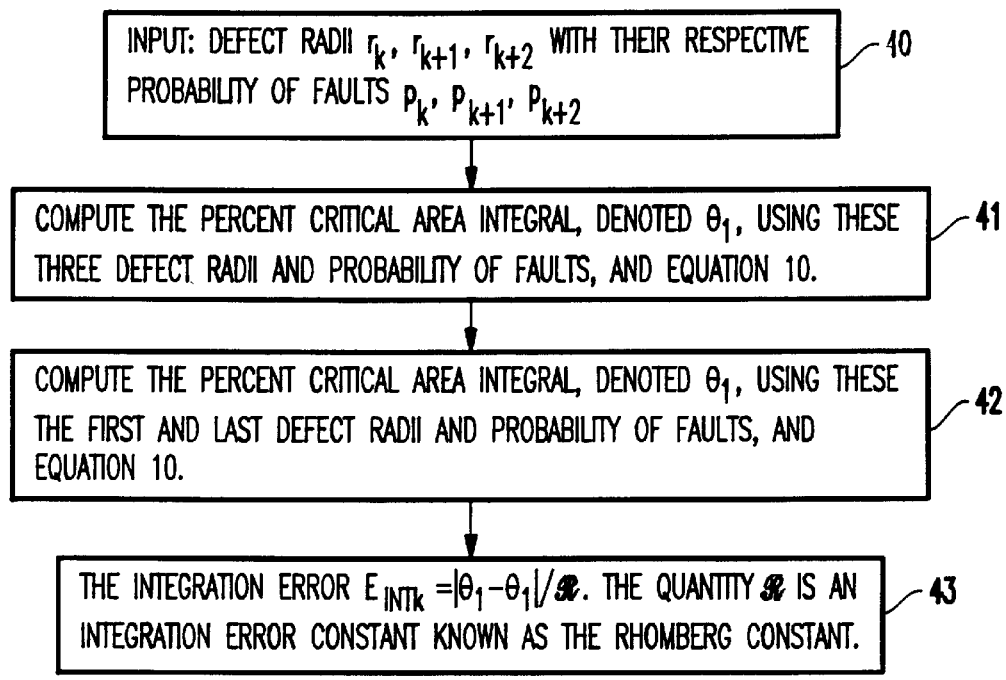
FIG. 4 is a flow diagram illustrating computation of the integration error of three defect radii for the percent critical area.

FIG. 4 is a flow diagram illustrating computation of the integration error of three defect radii for the percent critical area. The integration error of the average critical area integration is obtained from the sum of these errors over all the defect radii. The failure mechanism subscript i and the partition subscript p are omitted for clarity.

The invention receives defect radii $r_k$, $r_{k+1}$, $r_{k+2}$ with their respective probability of faults $P_k$, $P_{k+1}$, $P_{k+2}$, as inputs, as shown in item 40. Then, in item 41, the invention computes the percent critical area integral, denoted $0_1$ using three defect radii and probability of faults, and Equation 10. Next, in item 42, the invention computes the percent critical area integral, denoted $0_1$, using the first and last defect radii and probability of faults, and Equation 10. As shown in item 43, the integration error $E_{INTK}=|0_1-0_1|/\mathfrak{R}$. The quantity $\mathfrak{R}$ is an integration error constant known as the Rhomberg constant.

Figures 5, 6:
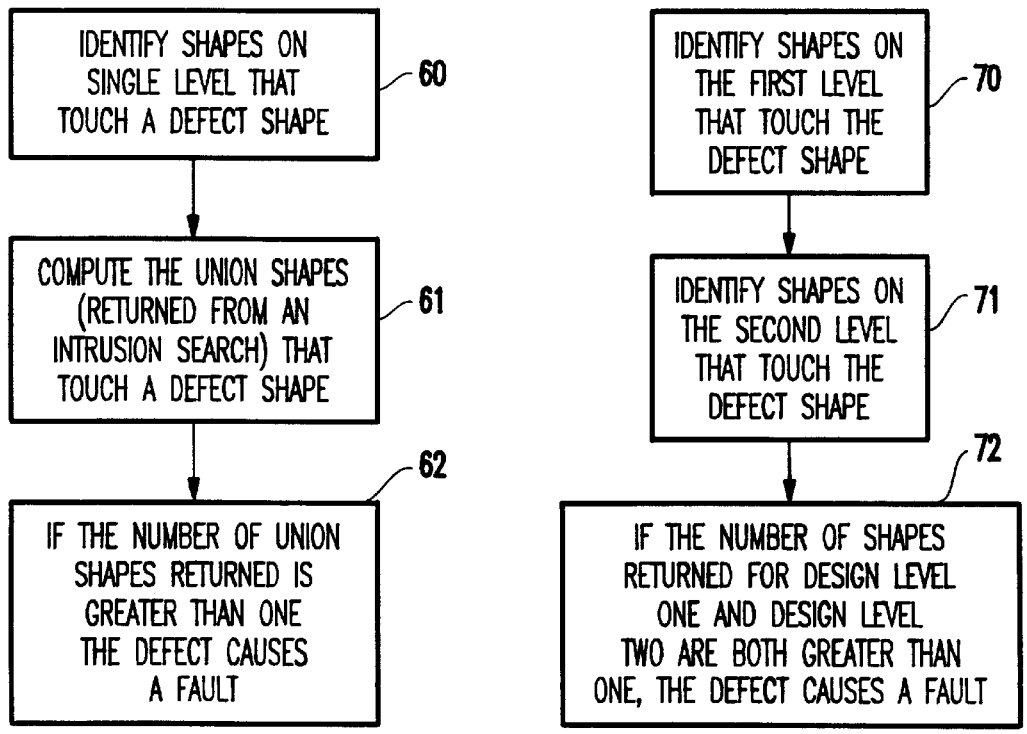
FIG. 5 is a flow diagram illustrating the method for single level short fault detection.
FIG. 6 is a flow diagram illustrating the method for double-level short fault detection.

FIG. 5 shows the method for determining the initial defect radii for discrete integration that computes the average critical area. This first stage of the numerical integration takes advantage of special properties of the probability of fault function to make good initial guesses for the defect radii. Furthermore, if the initial guesses do not yield a reasonable initial guess to the probability of fault function, the method can terminate with reasonable estimates of the average critical area. FIG. 6 uses this initial method and shows the complete method for determining the radii used in the full average critical area integration.

Figure 7:
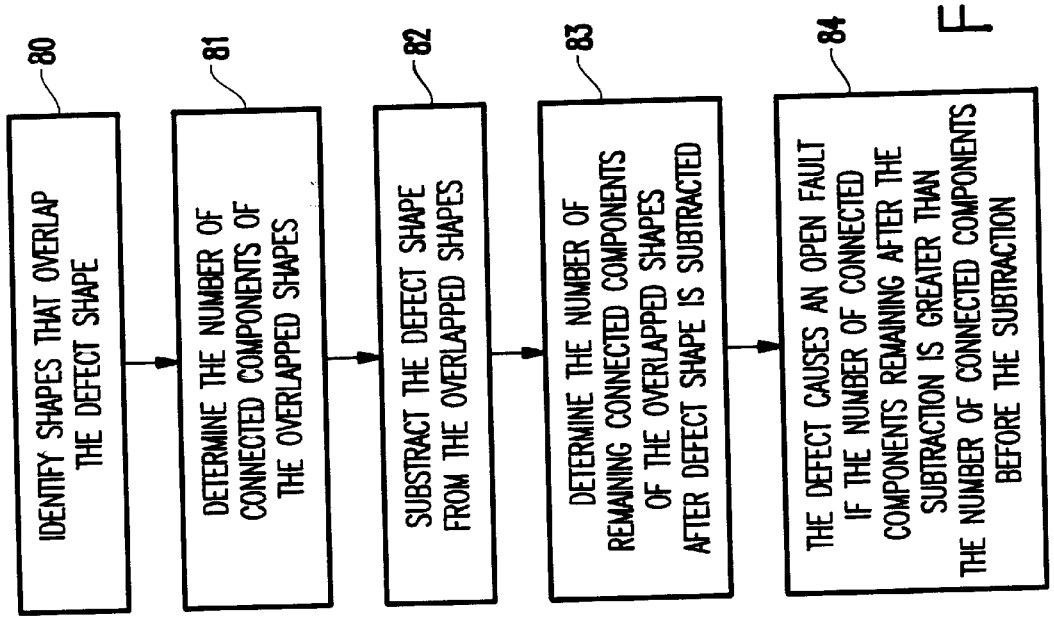
FIG. 7 is a flow diagram illustrating the method for opens fault detection.

The integration method relies on an estimate of the integration error. The method used to estimate the integration error is illustrated in FIG. 7.

When the integration stage of the yield computation method is complete for all failure mechanisms, the result is that a set of defect radii has been computed, such that the integration error criteria for all failure mechanisms is satisfied. Furthermore, as shown in FIG. 12, the initial numerical integration step that discovers the defect radii can be performed in parallel for each failure mechanism and each partition of the IC. The number of parallel processes is the number of failure mechanisms times the number of partitions of the IC.

Combining Equation 10 and Equation 8, the average number of faults for an IC is represented as a function of the probability of faults of the individual defect radii selected for each failure mechanism in Equation 11:

$$\Lambda = \Sigma_I \Sigma_K p_{ik} \cdot w_{ik} \cdot A \cdot D_{Di}. \quad \text{(Equation 11)}$$

For a partitioned IC, Equation 12 shows the average number of faults for an IC is:

$$\Lambda = \Sigma_I \Sigma_K \Sigma_P p_{ikp} \cdot w_{ikp} \cdot A_P \cdot D_{Di}. \quad \text{(Equation 12)}$$

After this initial stage in the measurements, an estimate of the yield is obtained. This estimate satisfies the initial integration error criteria, but it has statistical error arising from the Monte Carlo method of computation used to estimate the probability of faults of the individual defect radii. The next stage in the yield computation seeks to reduce this statistical error within a prescribed limit, with minimal computation effort. Henceforth, the inventive method has a list of defect radii for each failure mechanism, and no new defect radii will be added. The method for statistical error reduction merely increases the sample size for each defect radius, as needed to increase accuracy of the yield estimate.

The failure mechanisms and the techniques for computing whether a defect causes a fault may be implemented using a variety of programs for manipulating very large-scale integrated chip (VLSI) layouts. In a preferred embodiment, the techniques are implemented in a hierarchical shape processing program, which allows reduced execution time and data volume when used on hierarchically-structured data, typical of large VLSI designs.

The invention includes the various processes for fault determination (e.g., item 53 above) which are the building blocks for describing a failure mechanism. These building blocks are referred to as generic failure mechanisms. The preferred embodiment detailed here describes seven generic failure mechanisms. However, one ordinarily skilled in the art would understand that many other types of failure mechanisms could be described. The generic failure mechanisms are as follows:

1. single level shorts—improper electrical connection between two shapes on the same manufacturing level (or conductor plane) caused by a defect in the insulating area;
2. double level shorts—improper electrical connection between two shapes on different manufacturing levels (or conductor planes) caused by a defect in the insulating area;
3. opens—improper disconnection caused by a defect in the conductor;
4. partial opens—a partial, improper disconnection caused by a defect in the conductor;
5. blockage—a fault caused by a completely covered manufacturing shape, such as a via;
6. partial blockage—a fault caused by a partial coverage of a manufacturing shape, such as a via; and
7. conductor opens with contact(s) (or via(s))—a special case of opens which also considers blockage faults, which is useful for evaluating defects occurring at the line ends.

All of these generic failure mechanisms are discussed in detail below, and later, a method for combining specific instances of these generic failure mechanisms is described.

Referring again to FIG. 5, one embodiment of identifying faults causing electrical shorts on a single level is illustrated. A defect will cause a fault if it touches (e.g., electrically connects) two disconnected shapes or features (e.g., shapes in different nets). More specifically, evaluation of this failure mechanism starts by identifying shapes on a single level that touch the defect shape, as shown in item 60, and then computes the resulting unioned shapes (returned from an intrusion search, see FIG. 1 6A, discussed below), as shown in item 61. A fault is identified if the number of union shapes returned is greater than one, as shown in item 62. In other words, if a single defect forms a union with more than one design shape, the analysis of the failure mechanism will flag that defect as a shorting fault on a single level (e.g., see FIG. 17, discussed below).

In another embodiment, the invention identifies a failure mechanism where defects touching at least two disconnected shapes, where each shape is on a unique manufacturing level (e.g., different wiring levels of a multi-layer structure), cause an electrical shorting fault. This process includes, as shown in FIG. 6, identifying shapes on a first level that touch the defect shape, as shown in item 70 and identifying shapes on a second level that touch the defect shape, as shown in item 71. The defect is identified as causing a short (fault) on different levels if the number of shapes returned for level one and level two are both greater than one, as shown in item 72. This process is schematically illustrated in FIG. 18, discussed below.

As mentioned above, the invention identifies a defect shape that causes an open fault by determining whether the defect shape interacts with a design shape in such a way as to cut the design shape into at least two pieces. As shown in FIG. 7, the inventive methodology identifies shapes that overlap the defect shape, as shown in item 80; determines the number of connected components of the overlapped shapes (design shapes that overlap the defect shape from the previous step), as shown in item 81; subtracts the defect shape from the overlapped shapes, as shown in item 82; and determines the number of remaining connected components of the overlapped shapes after the defect shape is subtracted, as shown in item 83. The defect is determined to cause an open fault if the number of connected components remaining after the subtraction is greater than the number of connected components before the subtraction (i.e., if the defect breaks one or more components into multiple disconnected pieces) as shown in item 84. This process is schematically illustrated in FIG. 19, discussed below.

In another embodiment, the invention identifies a partially open fault if the defect shape intersects a design shape by more than a specified value. As shown in FIG. 8, the inventive method includes identifying shapes that overlap a defect shape, as shown in item 90; performing a difference operation on the overlapped shapes (subtracting the defect shape from the overlapping shapes) as shown in item 91; and comparing the square area of each shape returned by the difference function to a minimum threshold value, as shown in item 92. As shown in item 93, the defect is identified as causing a partially open fault if the number of shapes returned by the difference function is greater than one and if the area of each shape returned by the difference function is greater than the threshold value. Alternatively, the invention can iterate the overlapped shapes to analyze defect blockages, and the defect will be identified as causing a fault if an overlapped shape is blocked by more than a specified minimum percentage value, as shown in item 94. This process is schematically illustrated in FIG. 21, discussed below.

As mentioned above, the invention identifies a defect shape that causes an open fault by determining if the defect shape interacts with a design shape in such a way as to cut the design shape into at least two pieces. In another embodiment, the invention identifies an open fault by determining whether a contact or via shape is completely blocked. A contact or via is a pad or other similar structure which can be used to join the structure with an external connection (from another wiring level).

More specifically, as shown in FIG. 9, the inventive process identifies shapes on a first design level (e.g., a metal shape) which are overlapped by a defect shape, as shown in item 100; identifies shapes on a second design level (e.g., a contact shape) which are overlapped by the defect shape as shown in item 101; computes the union shapes returned from the first design level as shown in item 102; and computes the union shapes returned from the second design level as shown in item 103. The defect is considered to cause an open fault if a contact shape is completely covered by a defect shape as shown in item 104. This process is schematically illustrated in FIG. 20, discussed below.

Alternatively, this embodiment could perform a difference function on the first design level shapes as shown in item 105 and compare the square area of each shape returned by the difference function to a minimum threshold value, as shown in item 106. The defect would then be considered to cause a fault if the number of shapes returned by the difference function is greater than one and if the area of each shape is greater than the threshold value, as shown in item 107.

In another embodiment of the invention, the defect shape is considered to cause a fault if it completely covers a shape on a specified manufacturing level. As shown in FIG. 10, the inventive method includes identifying shapes on a specified level that overlap the defect shape, as shown in item 110 and computing union shapes from shapes that touch a defect shape, as shown in item 111. The defect causes a fault if the defect shape completely covers the unioned shape as shown in item 112. This process is schematically illustrated in FIG. 23, discussed below.

In another embodiment, the invention identifies a defect shape as causing a fault if the defect shape covers a design shape on a specified manufacturing level by more than a specified amount (e.g., partial blockage target value). This embodiment includes, as shown in FIG. 11, identifying design shapes on the specified manufacturing level that overlap the defect shape, as shown in item 120; computing union shapes from shapes that touch the defect shape, as shown in item 121; and calculating the intersection area of the defect shape and the union shape, as shown in item 122. The defect is determined to cause a fault if the calculated area is greater than the partial blockage target value, as shown in item 123. This process is schematically illustrated in FIG. 21, discussed below.

FIG. 12 is a flow diagram illustrating the method for partial blocks detection. Herein is an illustration of a method of computing a manufacturing yield of an integrated circuit which includes partitioning the circuit by area (as shown in item 130). In parallel, the invention creates a partition analysis by defect mechanism (131). Next, the process computes an initial average number of faults for each of the failure mechanisms and for each partition by numerical integration (132) and proceeds to calculate the statistical error computation as shown in item 133. If the statistical error is less than the MaxError as shown in item 134, the process is complete. If the statistical error is more than the MaxError, the process continues to the sample size computation step as shown in item 135 and further produces statistical error reductions as shown in item 136. Thereafter, yield estimate and error averaging are computed through successive reductions of the statistical error as shown in item 137. Finally, the computation completes when the statistical error is less than MaxError, or when the total computation effort exceeds a preselected limit.

Furthermore, in another embodiment of the invention, as shown in FIG. 12, the initial numerical integration step that discovers the defect radii can be performed in parallel for each failure mechanism and each partition of the IC. The number of parallel processes is the number of failure mechanisms times the number of partitions of the IC.

Further, the invention can combine (e.g., mix and match) each of the fault detecting processes (generic failure mechanisms) described above in such a way as to describe a failure mechanism pertaining to an individual manufacturing level (e.g., a wiring level in a semiconductor chip) or multiple levels. This allows proper accounting of defects that cause multiple, non mutually exclusive faults. Alternatively, failure mechanisms may be precisely defined, matching electrical testing specifications. The inventive fault-determining techniques can also be used in conjunction with other shape-processing operations (e.g., expansion or shrinking) well-known to those ordinarily skilled in the art in order to better simulate the incidence of fault-causing defects in the light of shape variations caused by manufacturing processes (e.g., photo-lithographic bias). Also, the shape-processing program which is used with the foregoing embodiments can simultaneously be used to implement the other shape-processing operations.

The computation of the probability of fault for each defect size of each failure mechanism is done using a statistical method, described by FIG. 1. Thus, this method incurs statistical error. This statistical error can be described by the statistical quantity know as variance, denoted by the function $\text{Var}(.)$. An accurate estimate of the variance of the probability of fault can be obtained using binomial functions. However, an inaccurate estimate can be obtained more efficiently by using the normal approximation of the binomial functions. For a given probability of fault $p_{ik}=f_{ik}/n_{ik}$, the variance is:

$$\text{Var}(p_{ik}) = p_{ik} \cdot q_{ik}/n_{ik}. \quad \text{(Equation 13)}$$

The quantity $q_{ik}=1-p_{ik}$. Using statistical formulae known to practitioners in the art, the variance of the percent critical area for a given failure mechanism is obtained:

$$\text{Var}(\theta_i) = \Sigma_K w_{ik}^2 \cdot p_{ik} \cdot q_{ik}/n_{ik}. \quad \text{(Equation 14)}$$

Equation 14 is extended to compute the variance of the average number of faults for an IC, and thus is an estimate of the statistical error in the yield computation:

$$\text{Var}(\Lambda) = \Sigma_I \Sigma_K (w_{ik} \cdot A \cdot D_{Di})^2 \cdot p_{ik} \cdot q_{ik}/n_{ik}, \quad \text{(Equation 15)}$$

And for the case of a partitioned IC:

$$\text{Var}(\Lambda) = \Sigma_I \Sigma_K \Sigma_P (w_{ikp} \cdot A_P \cdot D_{Di})^2 \cdot p_{ikp} \cdot q_{ikp}/n_{ikp}, \quad \text{(Equation 16)}$$

The actual error of the statistical computation can then be computed from the variance using the following Equation 17:

$$\text{Err}(\Lambda) = t \cdot \sqrt{(\text{Var}(\Lambda))}. \qquad \text{(Equation 17)}$$

In Equation 17, the $\sqrt{(.)}$ function represents the square root of the quantity within, and t is a constant related to the normal distribution and to the degree of confidence desired for the computation.

The inventive method completes the yield estimate computation through successive reductions of the statistical error. The computation completes when the statistical error is less than the maximum statistical error allowed, or when the total computation effort, measured as a maximum total sample size, exceeds a pre-selected limit. At each iteration, it, of the statistical error reduction, a new estimate of the average number of faults, denoted $\Lambda_{it}$, is computed and then averaged with the previous estimates using the following polling formulae:

$$\text{Var}(\Lambda) = 1/(\Sigma_{IT} 1/\text{Var}(\Lambda_{it})), \qquad \text{(Equation 18)}$$

$$\Lambda = \text{Var}(\Lambda) \cdot \Sigma_{IT} \Lambda_{it}/\text{Var}(\Lambda_{it}). \qquad \text{(Equation 19)}$$

Equation 18 also computes the combined variance resulting from the variances of all the iterations. For each of these iterations, the probability of fault for each failure mechanism and defect size is recomputed using a sample size computed from the relative importance (measured from the contribution to the total variance) of the current estimate of the probability of fault. The total sample size for each iteration is limited to $N_{it}$ samples. Using this desired sample size for an iteration of the statistical error reduction, the optimal number of samples per size is computed using the following formula:

$$n_{ik} = N_{it} \cdot ((w_{ik} \cdot A \cdot D_{Di} \cdot \sqrt{(p_{ik} \cdot q_{ik})})/(\Sigma_I \Sigma_K w_{ik} \cdot A \cdot D_{Di} \cdot \sqrt{(p_{ik} \cdot q_{ik})})). \qquad \text{(Equation 20)}$$

For a partitioned IC, the formula is:

$$n_{ikp} = N_{it} \cdot ((w_{ikp} \cdot A_P \cdot D_{Di} \cdot \sqrt{(p_{ikp} \cdot q_{ikp})})/(\Sigma_I \Sigma_K \Sigma_P w_{ikp} \cdot A_P \cdot D_{Di} \cdot \sqrt{(p_{ikp} \cdot q_{ikp})})). \qquad \text{(Equation 21)}$$

The above formula is derived by assuming that the current estimate for the probability of faults is close to the final value. The formula suffers from one problem, which is that when $p_{ik}$ is equal to 0 or to 1, the optimal sample size is 0. This problem is avoided by making sure that a minimum, non-zero sample size is used. Note that Equations 20 and 21 increase the sample sizes of the defect radii that have the most contribution to the variance of the average faults per IC. This effect minimizes the computational effort of the inventive method.

The sample size for each iteration of statistical improvement, $N_{it}$, is computed by taking a fraction of the total estimated number of samples, $N_{MAX}$, needed to obtain the average number of faults per IC within a certain error, $\text{Err}_{MAX}$:

$$N_{MAX} = (\Sigma_I (A \cdot D_{Di})^2 \cdot \theta_i \cdot (1 - \theta_i))/(\text{Err}_{MAX}/t)^2 \qquad \text{(Equation 22)}$$

The total estimated number of samples is computed after the integration stage is completed, when an inaccurate but useful estimate of the percent critical areas is known. With these estimates, the sample size for each iteration of statistical improvement can be chosen in various ways. The simplest is to compute a fraction of the total estimated effort per iteration by letting $N_{it} = N_{MAX}/32$. As the error approaches the desired error, a better estimate of $N_{it}$ is obtained by extrapolation of the trend in the statistical error.

Modern integrated circuits consist of more than 10 million flattened shapes. Future integrated circuits will contain 10–100 times as many shapes. A well-known technique for reducing shape database volumes is to group shapes and re-use these shape groupings wherever possible. A group of shapes is reused via a shape transform. Shape transforms and shapes are further grouped into other shape groups. This pattern of grouping is known as a nesting or hierarchy of shapes. The inventive method does not make any assumptions on the nesting of the shapes database. However, dealing with this huge data volume within reasonable computation times is important to the success of the inventive yield estimation. The inventive method uses three techniques to handle shapes database volumes. The first technique is to use a query of the nested shapes database, which is assumed to take advantage of the shape database, called a shape intrusion. The shape intrusion method is given an intruding shape, the defect of a given radius, and in return the intrusion returns all flattened shapes in the database which touch the defect. Efficient implementation of this intrusion method can be achieved by a combination of 2D shape data structures such as quad-trees or k-d trees with the inherent shape nesting. The second technique used is to partition or cut the integrated circuit into sub-circuits, or partitions, such that if the partitions are pieced back together, the original integrated circuit is obtained. A third technique used is to partition the shapes database by failure mechanism: each failure mechanism affects only a subset of the database shapes. Thus, it is possible to divide the shapes database of the IC into smaller databases, one per failure mechanism, each containing only the shapes on the unique manufacturing levels that are involved in a given failure mechanism. The result of these partitioning techniques is that the computations of the inventive method can be performed in a massively parallel system, with minimal communications overhead, which is limited to the original partitioning steps and the synchronization of the integration and statistical error reduction phases.

While the overall methodology of the invention is described above, the invention can be embodied in any number of different types of systems and executed in any number of different ways, as would be known by one ordinarily skilled in the art. For example, as illustrated in FIG. 13, a typical hardware configuration of an information handling/computer system in accordance with the invention preferably has at least one processor or central processing unit (CPU) 1400. For example, the central processing unit 1400 could include various shapes processing units, prediction units, computational units, sample size selectors, mapping units, weighting units, adders, subtractors, comparators, etc. Alternatively, as would be known by one ordinarily skilled in the art given this disclosure, multiple specialized CPU=s (or other similar individual functional units) could perform the same processing, modeling, weighting, adding, subtracting, comparing, etc.

The CPU 1400 is interconnected via a system bus 1401 to a random access memory (RAM) 1402, read-only memory (ROM) 1403, input/output (I/O) adapter 1404 (for connecting peripheral devices such as disk units 1405 and tape drives 1406 to the bus 1401), communication adapter 1407 (for connecting an information handling system to a data processing network) user interface adapter 1408 (for connecting a peripherals 1409, 1410 such as a keyboard, mouse, microphone speaker and/or other user interface device to the bus 1401), a printer 1412, and display adapter 1413 (for connecting the bus 1401 to a display device 1414). The invention could be implemented using the structure shown in FIG. 13 by including the inventive method within a computer program stored on the storage device 1405. Such a computer program would act on information supplied through the interface units 1409, 1410 or through the network connection 1407. The system would then automatically produce the final desired product on the display 1414, through the printer 1412 or back to the network 1407.

Referring now to FIGS. 14–27, a few geometric shapes that represent design level input shapes are shown. These shapes are a very small representation of the number of shapes that an integrated chip designer creates in the chip design process.

FIGS. 14–16B illustrate various conventional processing steps performed upon integrated circuit device structures (e.g., the difference function, intersect function, union function, and contains function). As would be known by one ordinarily skilled in the art, other similar functions exist; however, only these three are illustrated for sake of brevity.

FIGS. 17–27 illustrate exemplary situations of integrated circuit device structures and defect mechanisms (defect shapes) occurring on such structures and the operations discussed above applied to such defect mechanisms. While the defect shapes referenced in FIGS. 16B–27 are represented as being circular, as would be known by one ordinarily skilled in the art, these defect shapes can be represented as a variety of shape types such to as squares, rectangles, octagons, etc.

Referring now to FIG. 14 the difference function is illustrated. The difference function is defined as a function that creates shapes by subtracting the shape represented by item 150 from the shape represented by item 151. The resultant shape is shown as item 152. The difference function is used as part of the opens and opens with contacts failure mechanisms, discussed above. Item 150 represents a design input level shape (input level A) provided by the user. Item 151 represents a second design input level shape (input level B) provided by the user. Item 152 represents the resultant shape that is generated by using the difference function.

Similarly, FIG. 15 illustrates the intersect function. The intersect function creates new shapes which are common regions among shapes that overlap on different levels. Items 160 and 161 are data input level shapes. Item 162 is the result of applying the intersect function on the input data 160, 161.

The union function is shown in FIG. 16A. The union function creates a shape that is the combined area of the input shapes. Items 170 and 171 are data input level shapes. Item 172 is the result of applying the union function on them. The union function is used in many of the failure mechanisms to reduce the number of shapes to be processed.

FIG. 16B shows the contains function. The contains function determines if one shape is completely enclosed within another shape. More specifically, FIG. 16B illustrates cases where the design level shape is contained within a defect causing a failure 1703, 1704 and when it is not 1701, 1702. Item 1701 is a design level shape, item 1702 is a defect shape. As shown, the defect shape 1702 does not completely cover the design level shape 1701. Item 1703 is a design level shape and item 1704 is a defect shape. As shown, the design level shape 1704 is completely covered by the defect shape 1703.

In FIG. 17, the one level shorts failure mechanism, mentioned above, is illustrated. FIG. 17 is a graphical representation of the explanation described with respect to FIG. 5. Again, the one level shorts failure mechanism provides that a defect causes a failure if it touches two disconnected shapes on the same input design level (e.g., design level A). Items 180 and 181 represent shapes on the design input levels that are provided by the user. This is the level that is under analysis. Item 183 represents a simulated defect shape that causes a failure. The failure stems from the fact that the defect shape touches more than one design input level shape 182 (e.g., the number of union shapes returned is greater than one). Item 183 represents a defect that does not cause a failure due to the fact that it does not touch any design level shapes. Item 184 represents a defect shape that does not cause a failure because it only touches one design level shape.

The two level shorts failure mechanism, discussed above, is illustrated in FIG. 18. This diagram is a graphical representation of the explanation described in FIG. 6. The two level shorts failure mechanism provides that a defect causes a failure if it touches two disconnected shapes on two different input design levels (e.g., design level A and design level B). Item 190 represent shapes on one of the design input levels (level A) that are provided by the user. Items 191 and 192 represent shapes on another of the design input levels (level B) that are provided by the user. Both of these levels are under analysis. Item 195 represents a simulated defect shape that does not cause a failure. No failure is caused in this analysis because defect mechanism 195 only touches shapes on one of the two specified design levels. Item 193 is a defect shape that causes a failure because it touches at least one shape on each of the two specified design levels. Note that defect mechanism 194 would not produce a defect for this two level shorts mechanism; however, such a defect shape 194 would result in a failure under the shorts failure mechanism discussed above (e.g., FIGS. 7 and 18).

FIG. 19 shows the opens failure mechanism described with respect to FIG. 7 above. Again, with the opens failure mechanism, a defect causes a failure if it cuts a shape on the input design level into two pieces. Items 200 and 201 represent shapes on the design input levels (level A) that are provided by the user. Item 202 represents a simulated defect shape that does not cause a failure. No failure is caused because the analysis determines that defect mechanism 202 does not completely break the design shape 200 into two pieces. Similarly, item 204 is a defect shape that does not cause a failure because it touches a design level shape 201 but does not cut shape 201. Item 203 is a defect shape that causes a failure because it does break the design level shape 204 into two pieces.

In the opens with contacts failure mechanism, shown in FIG. 20, a defect causes a failure if it either cuts a shape on a specified design level or covers a shape on a second design level specified by the user. FIG. 20 is a graphical representation of the explanation described above with respect to FIG. 9. Items 210 and 215 represent shapes on a first design input level (e.g., level A) and items 211 and 214 represent shapes on a second design input level (e.g., level B). Item 212 represents a simulated defect shape that causes a failure because shape 212 completely covers item 211. Item 213 represents a defect shape that causes a failure because it cuts design level shape 215 in two. Item 216 is a defect shape that causes no failure.

FIG. 21 shows a partial opens failure mechanism in which a defect causes a failure if it opens a shape on the input design level by more that a user specified amount. FIG. 21 is a graphical representation of the explanation described in FIG. 8. Item 220 represents a shape on a design level that is provided by the user. Item 221 represents a simulated defect shape that causes a failure because shape 221 cuts item 220 by more than the user specified amount. Item 222 represents a simulated defect shape that does not cause a failure because shape 222 does not cut item 220 by more than the user specified amount.

The blockage failure mechanism mentioned above with respect to FIG. 10 is illustrated in FIG. 22. Again, the blockage failure mechanism provides that a defect mechanism cause a failure if the defect mechanism completely covers a design level shape. Items 231, 233, and 234 represent shapes on a design input level that are provided by the user. Items 232 represents a simulated defect shape that does not cause a failure because the defect does not cover item 231. Item 235 represents a defect shape that does cause a failure because it does cover item 234.

FIG. 23 shows a partial blockage failure mechanism in which a defect causes a failure if it covers a design level shape by more than a user specified amount. FIG. 23 is a graphical representation of the explanation described in FIG. 11. Items 240, 242, and 244 represent design input level shapes input by the user. Item 241 is a defect shape that causes no failure because it does not block item 240 by more than the user specified amount. Item 243 is a defect shape that causes a failure because it does block item 242 by more that the user specified amount. Item 245 is a defect shape that causes no failure because it does not block item 244.

FIG. 24 illustrates how the invention uses the difference function (e.g., FIG. 14 above) to determine a failing defect. Item 251 is a design input level and item 250 is a simulated defect shape. Item 252 illustrates the result of the difference function (e.g., subtraction). Defect mechanism 250 causes a failure because shape 251 is cut into two pieces 252.

Similarly, FIG. 25 illustrates how the invention uses the difference function to determine that a defect mechanism does not produce a failure. Item 260 is a design input level. Item 261 is a simulated defect shape that does not cut shape 260 into two pieces (262) and, therefore, is not a failure.

Further, FIG. 26 illustrates using the intersect function (e.g., FIG. 15 above) to find a partial blockage failure mechanism (e.g., FIG. 11 above). Item 271 is a design input level. Item 270 is a simulated defect shape. Item 272 illustrates the results of the intersect function. If the area of the resulting shape 272 is greater than the area specified by the user, a failure is recorded. As would be known by one ordinarily skilled in the art given this disclosure, the area of the intersect function applied to each of the failure mechanisms (opens, shorts, blocks, etc.) can be added together in such a way that the combination of their operations can constitute a failure.

FIG. 27 illustrates the process of combining failure mechanisms to identify a failure. More specifically, item 281 represents a design input level. Item 282 represents a non-failing defect shape because item 282 has no interaction with a design level shape. Item 283 represents a non-failing defect shape because item 283 does not cause an open or a partial open failure as determined by the difference function result 286. Item 284 represents a defect that causes an open as determined by the difference function result 287. In a preferred embodiment, failure 287 would be enough for this defect mechanism to record a failure. All additional failure conditions could be ignored. Item 285 represents a defect that causes a partial open as determined by the difference function result 288.

Given that photo layers are formed using multiple processing steps, many layers may include multiple failures. Mutually exclusive failures may be independently evaluated, and the faults are then simply summed to calculate a yield. However, this method will not be effective for failure mechanisms which are not mutually exclusive. Therefore, the invention uses Boolean algebra to combine generic failure mechanisms which return from a pass/fail analysis. The use of Boolean algebra allows for the definition of complex defect mechanisms that may or may not include mutually exclusive failure mechanisms.

Further, defect mechanisms that exactly match electrical or inline test data can also be defined in Boolean algebra terms. For example, polysilicon shorts may be combined with polysilicon-to-local-interconnect shorts. Also, a given random defect mechanism is evaluated so that it only identifies a defective chip once. Once an average probability of failure has been calculated, the critical area may be calculated by using the total area of evaluation or scaling this area to an area of interest for similar circuits.

The product of the critical area and the defect density produces the total faults, which may be converted to a yield using any widely published yield equation (e.g., negative binomial).

The summation of all of the faults for all of the mechanisms may be computed to an overall yield in the same manner. The contribution of the defect density to faults is used to set desired error limits and computational runtime goals.

Modern fabrication technologies for integrated circuits require upwards of 40 fabrication steps. Each of these fabrication steps is modeled by a defect mechanism, which, in turn, has its own average probability of failure. The inventive yield estimate is computed from a linear combination of the probability of failures. Since the contribution of each defect mechanism to the total yield is different by as much as a factor of 100, an important feature of the invention is the control of the accuracy of this computation.

More specifically, the inventive process for computing yield for a partitioned circuit with multiple defect mechanisms is an extension of the process described above for computing average probability of failure for a partitioned circuit. The invention treats each defect mechanism as if it were a partition. Therefore, the circuit is modeled as being partitioned into the number of defect mechanisms. The invention introduces an additional weight, namely, the defect density. Otherwise, the computations and method are the same as described above. One key to the effectiveness of this process is the computation of the individual sample sizes, through the use of the optimal sampling formulae, discussed above (e.g., FIG. 9).

The problem of yield computation for an integrated circuit has been a topic of research for over 30 years. Computer simulation of random defect yield has been implemented using various techniques. Current research has focused on different methods for computing the average probability of failure. However, the conventional systems have encountered many problems, which are overcome by this invention. In particular, previous solutions require simplified fault modeling mechanisms, flattened layouts, manual selection of defect sizes, manual selection of sample sizes, or other artificial analysis parameters.

The invention is very useful with large layouts because of the partitioning and massively parallel computation. Other benefits of the invention include that a numerical method is used to select discrete defect sizes (e.g., see the discussion of FIG. 8, above), a sampling method is used to select defect sample population sizes (e.g., see the discussion of FIG. 9, above), computational stages are combined to control statistical accuracy (FIG. 9, above), and that the inventive processes can be performed in parallel (e.g., see the discussion of FIG. 10, above).

Finally, the invention involves the complete yield estimation problem, not just the problem of computing the average probability of failures. Unlike conventional methods, the invention requires no assumptions about defect shapes, fault detection mechanisms, and in fact, allows flexible definitions for these variables.

While the invention has been described in terms of preferred embodiments, those skilled in the art will recognize that the invention can be practiced with modification within the spirit and scope of the appended claims.

What is claimed is:

1. A method of computing a manufacturing yield of an integrated circuit having device shapes, comprising:

sub-dividing said integrated circuit into failure mechanisms, computing an initial average number of faults for each of said failure mechanisms; and computing a final average number of faults for said integrated circuit by iteratively reducing a statistical error of said initial average number of faults for each of said failure mechanisms until said statistical error is below an error limit.

2. The method in claim 1, wherein said computing of said initial average number of faults includes numerical integration of an average probability of failure of each failure mechanism, wherein said numerical integration produces a list of defect sizes for each defect mechanism, and wherein said computing of said initial average includes setting a maximum integration error limit, a maximum sample size for a population of each of said defect sizes, and a maximum number of allowable faults for each failure mechanism.

3. The method in claim 1, wherein said reducing of said statistical error comprises:

selecting a total sample size of defects to be analyzed;

distributing said total sample size among all of said defect sizes, such that sample sizes for each defect size are selected to maximize the reduction in the statistical error;

computing a probability of fault for each defect size within each of said sample sizes; and computing individual average number of faults and individual statistical error for each of said sample sizes.

4. The method in claim 3, further comprising:

combining said individual average number of faults and said individual statistical error of each of said sample sizes to produce a combined average number of faults and a combined statistical error; and computing said manufacturing yield of said integrated circuit from said combined average number of faults and said combined statistical error.

5. The method in claim 3, wherein said computing individual average number of faults and individual statistical error for each of said sample sizes is performed simultaneously for each of said sample sizes.

6. The method in claim 1, further comprising partitioning said failure mechanisms by area.

7. The method in claim 1, wherein each of said failure mechanisms includes one or more defect mechanisms.

8. A method of computing a manufacturing yield of an integrated circuit having device shapes, comprising:

sub-dividing said integrated circuit into failure mechanism subdivisions, each of said failure mechanism subdivisions including one or more failure mechanisms and each of said failure mechanisms including one or more defect mechanisms;

partitioning said failure mechanism subdivisions by area into partitions;

pre-processing said device shapes in each partition;

computing an initial average number of faults for each of said failure mechanisms and for each partition by numerical integration of an average probability of failure of each failure mechanism, wherein said numerical integration produces a list of defect sizes for each defect mechanism, and wherein said computing of said initial average includes setting a maximum integration error limit, a maximum sample size for a population of each defect size, and a maximum number of allowable faults for each failure mechanism; and computing a final average number of faults for said integrated circuit by iteratively reducing a statistical error of said initial average number of faults for each of said failure mechanisms until said statistical error is below an error limit.

9. The method in claim 8, wherein said reducing of said statistical error comprises:

selecting a total sample size of defects to be analyzed;

distributing said total sample size among all of said defect sizes, such that sample sizes for each defect size are selected to maximize the reduction in the statistical error;

computing a probability of fault for each defect size within each of said sample sizes;

computing individual average number of faults and individual statistical error for each of said sample sizes;

combining said individual average number of faults and said individual statistical error of each of said sample sizes to produce a combined average number of faults and a combined statistical error; and computing said manufacturing yield of said integrated circuit from said combined average number of faults and said combined statistical error.

10. The method in claim 9, wherein said computing individual average number of faults and individual statistical error for each of said sample sizes is performed simultaneously for each of said sample sizes.

11. A method of computing a manufacturing yield of a device, comprising:

generating probabilities of occurrences of defect mechanisms within said device;

logically dividing said device into partitions, each of said partitions having a defect mechanism density;

performing a failure analysis on each of said defect mechanisms;

weighting results of said failure analysis for each of said partitions by said defect mechanism density to produce weighted results; and combining said weighted results to produce said yield.

12. The method in claim 11, further comprising integrating said results of said failure analysis to produce an average probability that a defect mechanism will occur at a specific location on said device.

13. The method in claim 12, wherein said defect mechanisms have different sizes and said integrating is performed over each of said different sizes.

14. The method in claim 13, wherein an integration error of said average probability is controlled by restricting said sizes.

15. The method in claim 12, wherein a statistical error of said average probability is controlled by restricting a sample size of said defect mechanisms.

16. A method of computing a manufacturing yield of a device, comprising:
  predicting a likelihood of occurrence of defects on said device;
  computing a probability of failure for each of said defects;
  iteratively reducing a statistical error of said probability of failure for each of said defects until said statistical error is below an error limit; and
  computing a probability of failure for said device based on said likelihood of occurrence and said probability of failure for each of said defects.

17. The method in claim 16, wherein said predicting includes predicting a size of said defects and said computing a probability of failure for each of said defects includes computing a probability of failure for each defect mechanism size.

18. The method in claim 16, wherein said predicting includes predicting a location and size of said defects, and said computing of said probability of failure for said device includes computing a probability that a defect having a size greater than a minimum size will occur at a location that would cause a failure.

19. The method in claim 16, wherein said computing a probability of failure for each of said defects is performed simultaneously for each of said defects.

20. The method in claim 16, further comprising controlling statistical error of said probability of failure for said device by controlled selection of a sample size of said defects in said predicting step.

21. The method in claim 16, further comprising controlling integration error of said probability of failure for said device by controlled selection of sizes of said defects and controlled selection of a number of said sizes.

22. The method in claim 16, wherein said defects comprise particles of foreign matter.

23. A program storage device readable by machine, tangibly embodying a program of instructions executable by said machine to perform a method of computing a manufacturing yield of a device, said method comprising:
  predicting a likelihood of occurrence of defects on said device;
  computing a probability of failure for each of said defects;
  iteratively reducing a statistical error of said probability of failure for each of said defects until said statistical error is below an error limit; and
  computing a probability of failure for said device based on said likelihood of occurrence of said defects and said probability of failure for each of said defects.

24. The program storage device in claim 23, wherein said predicting includes predicting a size of said defects and said computing a probability of failure for each of said defects includes computing a probability of failure for each defect mechanism size.

25. The program storage device in claim 23, wherein said predicting includes predicting a location and size of said defects and said computing of said probability of failure for said device includes computing a probability that a defect having a size greater than a minimum size will occur at a location that would cause a failure.

26. The program storage device in claim 23, wherein said computing a probability of failure for each of said defects is performed simultaneously for each of said defects.

27. The program storage device in claim 23, wherein said method further comprises controlling statistical error of said probability of failure for said device by controlled selection of a sample size of said defects in said predicting step.

28. The program storage device in claim 23, wherein said method further comprises controlling integration error of said probability of failure for said device by controlled selection of sizes of said defects and controlled selection of a number of said sizes.

29. The program storage device in claim 23, wherein said defects comprises particles of foreign matter.

30. A system for computing a manufacturing yield of a device, comprising:
  a prediction unit outputting a likelihood of occurrence of defects on said device;
  a computational unit computing a probability of failure for each of said defects, iteratively reducing a statistical error of said probability of failure for each of said defects until said statistical error is below an error limit, and computing a probability of failure for said device based on said likelihood of occurrence of said defects and said probability of failure for each of said defects.

31. The system in claim 30, wherein said prediction unit predicts a size of said defects and said computational unit computes a probability of failure for each defect mechanism size.

32. The system in claim 30, wherein said prediction unit predicts a location and size of said defects and said computational unit computes a probability that a defect having a size greater than a minimum size will occur at a location that would cause a failure.

33. The system in claim 30, further comprising a plurality of said computational units simultaneously computing a probability of failure for each of said defects.

34. The system in claim 30, further comprising a sample size selector controlling statistical error of said probability of failure for said device by controlled selection of a sample size of said defects in said predicting step.

35. The method in claim 30, further comprising a sample size selector controlling integration error of said probability of failure for said device by controlled selection of sizes of said defects and controlled selection of a number of said sizes.

36. The method in claim 30, wherein said defects comprise particles of foreign matter.

* * * * *